United States Patent
Soeno

(10) Patent No.: US 7,938,990 B2
(45) Date of Patent: May 10, 2011

(54) PATTERN DRAWING METHOD, METHOD OF MANUFACTURING A MASTER DISK FOR MANUFACTURING INFORMATION RECORDING MEDIA, AND METHOD OF MANUFACTURING AN INFORMATION RECORDING MEDIUM

(75) Inventor: Yoshikazu Soeno, Tokyo (JP)

(73) Assignee: TDK Corporation, Tokyo (JP)

( * ) Notice: Subject to any disclaimer, the term of this patent is extended or adjusted under 35 U.S.C. 154(b) by 1515 days.

(21) Appl. No.: 11/033,138

(22) Filed: Jan. 12, 2005

(65) Prior Publication Data

US 2005/0151284 A1 Jul. 14, 2005

(30) Foreign Application Priority Data

Jan. 13, 2004 (JP) ................... 2004-004911

(51) Int. Cl.
*B29D 11/00* (2006.01)
*G11B 11/00* (2006.01)
(52) U.S. Cl. .... 264/1.33; 264/1.36; 264/2.5; 369/13.56; 425/810; 430/296
(58) Field of Classification Search .................. 425/810, 425/174.4; 369/101, 13.56; 250/442.11, 250/492.1; 264/1.1, 1.33, 2.5, 1.36, 485; 430/296
See application file for complete search history.

(56) References Cited

U.S. PATENT DOCUMENTS 6,650,611 B1 * 11/2003 Kamimura et al. ........... 369/101

2002/0172130 A1 11/2002 Wada
2003/0161222 A1 8/2003 Komatsu et al.

FOREIGN PATENT DOCUMENTS

| JP | 2000-207738 | 7/2000 |
|----|-------------|--------|
| JP | 2003-091806 | 3/2003 |
| JP | 2003-98650  | 4/2003 |
| JP | 2003-248923 | 9/2003 |
| JP | 2004-164856 | 6/2004 |

OTHER PUBLICATIONS

English language Abstract of JP 2003-248923.
English language Abstract of JP 2003-98650.
English Language Abstract of JP 2000-207738.
English Language Abstract of JP 2003-091806.
English Language Abstract of JP 2004-164856.

* cited by examiner

*Primary Examiner* — Mathieu D. Vargot
(74) *Attorney, Agent, or Firm* — Greenblum & Bernstein, P.L.C.

(57) ABSTRACT

A pattern drawing apparatus which is capable of reducing manufacturing costs of information recording media. A partial drawing process is executed in response to output of a reference signal, for drawing, after being on standby for a predetermined standby time period, pattern segments, which are obtained by dividing patterns forming a servo pattern in the direction of the width of the patterns, by irradiation of a resin layer with an electron beam. A drawing position-changing process is executed for changing the irradiation position of the electron beam on the resin, toward a center of rotation of a substrate or away from the center of rotation, within a range of the effective drawing width of the electron beam. These processes are executed a plurality of times to draw an exposure pattern on the resin layer.

8 Claims, 9 Drawing Sheets

F I G. 4
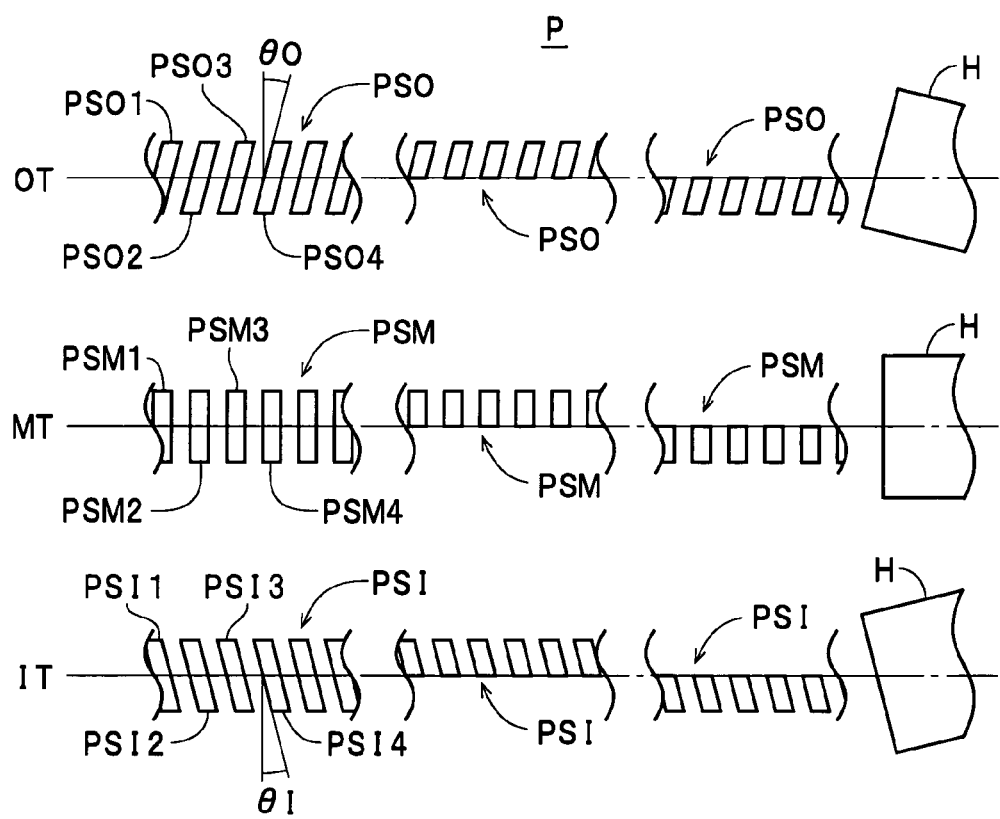

PATTERN DRAWING METHOD, METHOD OF MANUFACTURING A MASTER DISK FOR MANUFACTURING INFORMATION RECORDING MEDIA, AND METHOD OF MANUFACTURING AN INFORMATION RECORDING MEDIUM

BACKGROUND OF THE INVENTION

1. Field of the Invention

The present invention relates to a pattern drawing apparatus which draws an exposure pattern for forming a concave/convex pattern for manufacturing information recording media, a method of manufacturing a master disk for manufacturing information recording media, using a concave/convex pattern formed using an exposure pattern drawn by the pattern drawing apparatus, and a method of manufacturing an information recording medium itself using the concave/convex pattern.

2. Description of the Related Art

Today, a demand for high density recording on magnetic recording and reproduction devices, such as HDDs, is more and more increasing. To increase the density of tracks by narrowing the tracks is now being studied as one of methods to fulfill the demand. In order to realize high density recording by this method, however, it is necessary to form a highly precise servo pattern which can realize accurate tracking servo, on magnetic recording media. In these days, it is popular to form a servo pattern by recording magnetically on each track via a magnetic head. In this case, as the density has become higher (the number of tracks has been increased), inaccuracy of the servo pattern, caused by inaccuracy in the positioning of the head, has come to be outstanding. Moreover, the time needed to record (form) the servo pattern has come to be longer. As a result, an increase in the manufacturing cost of magnetic recording and reproduction devices has been brought about. Some methods have been proposed in order to solve these problems. One of the methods is to magnetically transfer the whole of a servo pattern, formed with high accuracy beforehand, to the recording layer of a magnetic recording medium in a single operation, and another is to form the whole of physical asperities (protrusions and depressions) on a recording layer, as a servo pattern also formed with high accuracy, in a single operation.

More specifically, as the method of manufacturing an information carrier for transferring the whole of a servo pattern or the like to the recording layer of a magnetic recording medium in a single operation, there has been proposed a method of drawing an exposure pattern for forming a servo pattern or the like, using an electron beam exposure apparatus, in Japanese Laid-Open Patent Publication (Kokai) No. 2000-207738. In this method, as shown in FIG. 2 in the publication, firstly, a heavy metal film is formed on a ferromagnetic thin film formed on a non-magnetic substrate through vapor deposition of a heavy metal, such as Au, by the vacuum vapor deposition method. Secondly, after forming a resist film covering the heavy metal film, a predetermined pattern (mask) of a photoresist film is formed e.g. by the photolithography method. Next, a plurality of exposure position reference marks and a pattern center mark are formed on the ferromagnetic thin film, through etching of the heavy metal film e.g. by the dry etching method, using the formed pattern. Subsequently, an electron beam-sensitive resist is applied on the ferromagnetic thin film such that the resist covers the formed exposure position reference marks and the pattern center mark. Thus, a material on which a pattern is to be formed (material for drawing) is produced.

Then, as shown in FIG. 1 in the publication, the material for drawing is set on an electron beam drawing apparatus. At this time, the position of the pattern center mark on the material for drawing is detected by emitting an electron beam with an electron gun to detect reflected electrons with an electron detector, while driving an X-Y stage. Then, after rotating the material for drawing, through a predetermined angle by driving an air spindle motor, the position of the pattern center mark is detected again. As a result, an amount of deviation of the center of rotation of the material for drawing by the air spindle motor from the pattern center mark is calculated. Then, a pattern for manufacturing information carriers (information recording media) is drawn on the electron beam-sensitive resist, by the electron beam drawing apparatus. More specifically, the electron gun emits the electron beam to irradiate the electron beam-sensitive resist, while rotating the material for drawing by the air spindle motor. At this time, the emitted electron beam is reflected from exposure position reference marks. Therefore, by detecting reflected electrons using the electron detector, the moment in time at which the electron beam passes each exposure position reference mark (the irradiation position of the electron beam overlaps the exposure position reference mark) is detected.

Further, the electron beam drawing apparatus draws a portion of the pattern by performing ON-OFF control of the electron beam according to the shape of a pattern to be drawn, with reference to each time point the electron beam has passed an exposure position reference mark. In doing this, the irradiation position of the electron beam is finely tuned by an electron beam deflector, according to the amount of deviation of the center of rotation on the material for drawing from the pattern center mark. Further, after one rotation of the material for drawing, the material for drawing (air spindle motor) is moved radially by the diameter of a spot of the electron beam by driving the X-Y stage, and the drawing processing described above is continued. By executing the drawing process described above on the whole surface of the material for drawing, a pattern for manufacturing an information carrier is drawn on the electron beam-sensitive resists. After that, portions which are not irradiated with the electron beam are removed by processing the electron beam-sensitive resist to form a concave/convex pattern. Then, by etching the ferromagnetic thin film, using this concave/convex pattern as a mask, a thin film pattern is formed as shown in FIG. 3 in the publication, to complete a master information carrier.

From the study of the electron beam exposure apparatus described above, the present inventor found out the following points for improvement: In the conventional electron beam drawing apparatus, the moment in time at which the irradiation position of the electron beam overlaps an exposure position reference mark is detected by the electron detector. Then, the apparatus draws a desired pattern at a desired position of an electron beam-sensitive resist by performing ON-OFF control of the electron beam with reference to the moment of the detection. Therefore, it is necessary to form a plurality of exposure position reference marks in advance on the material on which a pattern is to be drawn. Because of this, the conventional electron beam drawing apparatus suffers from the problem that an increase in the manufacturing cost of master information carriers (information recording media) has been brought about, due to an extra process for forming a plurality of the exposure position reference marks on the material for drawing.

SUMMARY OF THE INVENTION

The present invention has been made in view of these problems, and a main object thereof is to provide a pattern drawing apparatus, a method of manufacturing a master disk for manufacturing information recording media, and a method of manufacturing an information recording medium, which are capable of reducing manufacturing costs of information recording media.

To attain the above object, in a first aspect of the present invention, there is provided a pattern drawing apparatus including a rotating mechanism that is configured to be capable of having a substrate placed thereon and rotate the substrate having a resin layer formed on a surface thereof, for having a concave/convex pattern formed on the resin layer for producing information recoding media, a moving mechanism that moves the rotating mechanism along a plane on which the substrate is rotated by the rotating mechanism, a reference signal generating section that generates a reference signal synchronous with rotation of the substrate with reference to either an internal signal generated within the rotating mechanism or a rotation drive signal supplied to the rotating mechanism, a beam emitting section that emits a drawing beam toward the resin layer, and a control section that controls the rotating mechanism and the moving mechanism, and timing of both emission of the drawing beam and stoppage of the emission of the drawing beam from the beam emitting section, the pattern drawing apparatus being capable of drawing a concentric exposure pattern for forming the concave/convex pattern on the resin layer, wherein the beam emitting section is configured to be capable of emitting the drawing beam that has an effective drawing width narrower than a width and a length of each of patterns forming the exposure pattern, and wherein the control section executes a partial drawing process and a drawing position-changing process alternately a plurality of times, the partial drawing process for causing the beam emitting section to be on standby for a predetermined standby time period in response to output of the reference signal from the reference signal generating section, and then causing the beam emitting section to emit the drawing beam so as to draw a part of the pattern which is partial in a direction of the width of the pattern, and the drawing position-changing process for changing a position on the resin layer where the part is to be drawn by the partial drawing process, in a predetermined one of a direction toward a center of rotation of the substrate by the rotating mechanism and a direction away from the center of rotation, within a range of the effective drawing width, to thereby draw the exposure pattern on the resin layer. It should be noted that in the present invention, the "width of the pattern" is intended to mean the size of a pattern measured in a direction toward or away from the center of rotation of a substrate, and the "length of the pattern" is intended to mean the size of the pattern measured in the direction of rotation of the substrate.

According to this pattern drawing apparatus, to draw the exposure pattern on the resin layer, there are alternately executed a plurality of times the partial drawing process for drawing segments divided in the direction of the width of the patterns by emitting the electron beam after being on standby over the standby time period defined in advance from the detection of the delivery of the reference signal, and the drawing position-changing process for changing the drawing position on which drawing is executed by the partial drawing process. As a result, the formation of marks or the like for specifying reference positions on the substrate can be made unnecessary. This makes it possible to reduce the manufacturing costs of the concave/convex pattern for manufacturing information recording media. Accordingly, it is possible to reduce the manufacturing costs of a master disk for manufacturing information recording media manufactured using the concave/convex pattern and information recording media manufactured using the master disk. Further, since patterns having desired skew angles given thereto can be drawn simply by changing and setting the standby time period before the start of the emission of the electron beam as required, it is possible to manufacture the information recording media from which the servo patterns and the like drawn thereon can be accurately read. Further, it is unnecessary to form marks or the like for specifying reference positions, so that e.g. in drawing the exposure pattern for manufacturing the master disk using the pattern drawing apparatus, it is possible to dispense with a process for forming a mark for specifying a central position, and a process for causing the mark specifying the central position to coincide with the center of rotation of the substrate, thereby making it possible to draw the exposure pattern accurately and easily.

Further, in a second aspect of the present invention, there is provided a pattern drawing apparatus according to a including a rotating mechanism that is configured to be capable of having a substrate placed thereon and rotate the substrate having a resin layer formed on a surface thereof, for having a concave/convex pattern formed on the resin layer for producing information recoding media, a moving mechanism that moves the rotating mechanism along a plane on which the substrate is rotated by the rotating mechanism, a reference signal generating section that generates a reference signal synchronous with rotation of the substrate with reference to either an internal signal generated within the rotating mechanism or a rotation drive signal supplied to the rotating mechanism, a beam emitting section that emits a drawing beam toward the resin layer, a beam deflecting section that deflects the drawing beam emitted from the beam emitting section, and a control section that controls the rotating mechanism and the moving mechanism, a direction of deflection of the drawing beam by the beam deflecting section, and timing of both emission of the drawing beam and stoppage of the emission of the drawing beam from the beam emitting section, the pattern drawing apparatus being capable of drawing a concentric exposure pattern for forming the concave/convex pattern on the resin layer, wherein the beam emitting section is configured to be capable of emitting the drawing beam that has an effective drawing width narrower than a width and a length of each of patterns forming the exposure pattern, and wherein the control section executes a drawing process for causing the beam emitting section to be on standby for a predetermined standby time period in response to output of the reference signal from the reference signal generating section, and then causing the beam emitting section to emit the drawing beam, while at the same time causing the beam deflecting section to reciprocate the drawing beam in a direction of the width of the pattern to be drawn, so as to draw the pattern, to thereby draw the exposure pattern on the resin layer.

According to this pattern drawing apparatus, the exposure pattern is drawn on the resin layer by executing the drawing process in which after being on standby over the standby time period defined in advance from the detection of the delivery of the reference signal, the electron beam is caused to be emitted while at the same time reciprocating the same in the direction of the width of the patterns to be drawn, to draw patterns. As a result, the formation of marks or the like for specifying reference positions on the substrate can be made unnecessary. This makes it possible to reduce the manufacturing costs of the master disk for manufacturing information recording media, and information recording media manufactured using the master disk. Further, since patterns having desired skew angles θO or θI given thereto can be drawn simply by deflecting the direction of reciprocation of the electron beam as required, it is possible to manufacture the information recording media from which the servo patterns and the like drawn thereon can be accurately read. Further, it is unnecessary to form marks or the like for specifying reference positions, so that e.g. in drawing the exposure pattern for manufacturing the master disk for manufacturing information recording media using the pattern drawing apparatus, it is possible to dispense with a process for forming a mark for specifying a central position, and a process for causing the mark specifying the central position to coincide with the center of rotation of the substrate, thereby making it possible to draw the exposure pattern accurately and easily.

In this case, it is possible to configure the pattern drawing apparatus such that the exposure pattern includes at least one of a servo pattern for tracking servo and a data track pattern for data recording. It should be noted that in the present specification, one servo pattern is assumed to be formed by a plurality of quadrilateral patterns (marks, shapes of dots). This configuration enables information recording media enabling accurate recording and reproduction of information.

Further, it is possible to configure the pattern drawing apparatus such that the exposure pattern is formed by giving a predetermined skew angle to the at least one of the patterns. This configuration makes it possible to manufacture information recording media from which servo patterns can be accurately read from an outer-diameter area and an inner-diameter area of a disk.

Further, it is possible to configure the reference signal generating section such that the reference signal generating section outputs the reference signal a plurality of times during one rotation of the substrate caused by the rotating mechanism. With this configuration, e.g. compared with a configuration for delivering the reference signal once per one rotation of the substrate, a time period from the time point when each reference signal is delivered to a time point when the drawing of the servo pattern or the like is to be started is shortened, whereby it is possible to more accurately draw the servo patterns and the like to be drawn per one rotation of the substrate.

Further, it is possible to configure the pattern drawing apparatus such that the exposure pattern includes servo patterns to be drawn within a plurality of servo pattern areas for tracking servo and the reference signal generating section outputs the reference signal a plurality of times per one rotation of the substrate, a number of the times corresponding to a number of the servo pattern areas within which the servo patterns are to be drawn per one rotation of the substrate caused by the rotating mechanism. It should be noted that in the present specification, an area in which one servo pattern is to be drawn (area in which one servo pattern is drawn) is referred to as a servo pattern area. With this configuration, it is possible to determine timing in which the drawing of each of all the servo patterns is to be stared, based on the delivery of the reference signal which is executed in association with each of the servo patterns. This makes it possible to more accurately draw the servo patterns which should be drawn per one rotation of the substrate.

To attain the above object, in a third aspect of the present invention, there is provided a method of manufacturing a master disk for manufacturing information recording media, comprising the steps of executing a predetermined process on the resin layer after drawing the exposure pattern on the resin layer using one of the pattern drawing apparatuses as described above to thereby form the concave/convex pattern, and forming the master disk having a concave/convex pattern transferred thereto, using the formed concave/convex pattern.

According to the method of manufacturing the master disk for manufacturing information recording media, the master disk having a concave/convex pattern transferred thereto is manufactured by using the concave/convex pattern formed by executing a predetermined treatment on a resin layer having the exposure pattern drawn thereon using the pattern drawing apparatus described above. As a result, the formation of marks or the like for specifying reference positions on the substrate can be made unnecessary. This makes it possible to reduce the manufacturing costs of the master disk for manufacturing information recording media. Since the master disk is manufactured by drawing thereon the exposure pattern provided with the skew angles defined in advance for each of the patterns forming a servo pattern within each servo pattern area, it is possible to manufacture a master disk capable of manufacturing information recording media from which the servo patterns and like drawn thereon can be accurately read from an outer-diameter area and an inner-diameter area of a disk. Further, when the exposure pattern is drawn by the pattern drawing apparatus, after executing a partial drawing process for drawing patterns forming the servo pattern and the like within one servo pattern area, there is executed a partial drawing process for drawing the data track pattern and the like to be formed between the one servo pattern area and a servo pattern area where a servo pattern and the like should be drawn next. This makes it possible to collectively draw servo patterns and data track patterns. Therefore, it is possible to manufacture the master disk for manufacturing information recording media, which is capable of collectively forming high-precision servo patterns and data track patterns for recording data.

To attain the above object, in a fourth aspect of the present invention, there is provided a method of manufacturing an information recording medium, comprising the step of forming the information recording medium having a concave/convex pattern transferred thereto using the concave/convex pattern formed on the master disk for manufacturing information recording media, the master disk being manufactured by the method described above.

According to the method of manufacturing an information recording medium, by using the master disk for manufacturing information recording media described above, in which the concave/convex pattern corresponds to the exposure pattern drawn by one of the pattern drawing apparatuses described above, it is possible to reduce the manufacturing costs of the information recording media since the manufacturing costs of the master disk is low. Further, by using the master disk formed with the concave/convex pattern in which the skew angle is given to servo patterns of portions corresponding to the outer-diameter area and the inner-diameter area, it is possible to enable the servo patterns and the like to be read accurately. Further, in drawing the exposure pattern using the pattern drawing apparatus during the manufacturing of the master disk, a partial drawing process for drawing patterns forming the servo pattern and the like within one servo pattern area is first executed, and then there is executed a partial drawing process for drawing the data track pattern and the like to be formed between the one servo pattern area and a servo pattern area where a servo pattern and the like should be drawn next. This makes it possible to collectively draw servo patterns and data track patterns. Therefore, it is possible to collectively form high-precision servo patterns having desired skew angles given thereto, and data track patterns for recording data.

To attain the above object, in a fifth aspect of the present invention, there is provided a method of manufacturing an information recording medium, comprising the steps of drawing the exposure pattern on the resin layer formed on an information recording medium intermediate as the substrate, using one the pattern drawing apparatuses described above, forming the concave/convex pattern by executing a predetermined process on the resin layer, and producing the information recording medium using the concave/convex pattern.

According to this method of manufacturing an information recording medium, the information magnetic recording medium is manufactured using the concave/convex pattern that is formed by drawing the exposure pattern on a resin layer formed on an intermediate using one of the pattern drawing apparatuses described above and then executing a predetermined processing on the resin layer. As a result, it is unnecessary to form marks for specifying reference positions on the intermediate, as distinct from the method of starting the drawing of patterns by detecting the marks or the like for specifying the reference positions. Therefore, the manufacturing costs of the information recording media can be reduced. In this case, the information recording medium is manufactured by drawing the exposure pattern in which each of patterns forming a servo pattern within each servo pattern area is given a skew angle defined in advance, whereby it is possible to manufacture an information recording medium which enables servo patterns and the like to be accurately read from an outer-diameter area and an inner-diameter area of a disk. Further, when the exposure pattern is drawn by the drawing apparatus, after executing a partial drawing process for drawing patterns forming a servo pattern and the like within one servo pattern area, there is executed a partial drawing process for drawing a data track pattern and the like to be formed between the one servo pattern area and a servo pattern area where a servo pattern and the like should be drawn next. This makes it possible to collectively draw servo patterns and data track patterns. Therefore, it is possible to collectively form high-precision servo patterns and data track patterns for recording data.

It should be noted that the present disclosure relates to the subject matter included in Japanese Patent Application No. 2004-004911 filed Jan. 13, 2004, and it is apparent that all the disclosures therein are incorporated herein by reference.

BRIEF DESCRIPTION OF THE DRAWINGS

These and other objects and features of the present invention will be explained in more detail below with reference to the attached drawings, wherein:

FIG. 4 is a pattern diagram showing an example of the exposure pattern drawn on the substrate;

DESCRIPTION OF THE PREFERRED EMBODIMENTS

The invention will now be described in detail with reference to the accompanying drawings showing a pattern drawing apparatus, a method of manufacturing a master disk for manufacturing information recording media, and a method of manufacturing an information recording medium, according to a preferred embodiment of the present invention.

First, a description will be given of the configuration of an electron beam drawing apparatus 1 according to the present invention with reference to the drawings.

Figure 1:
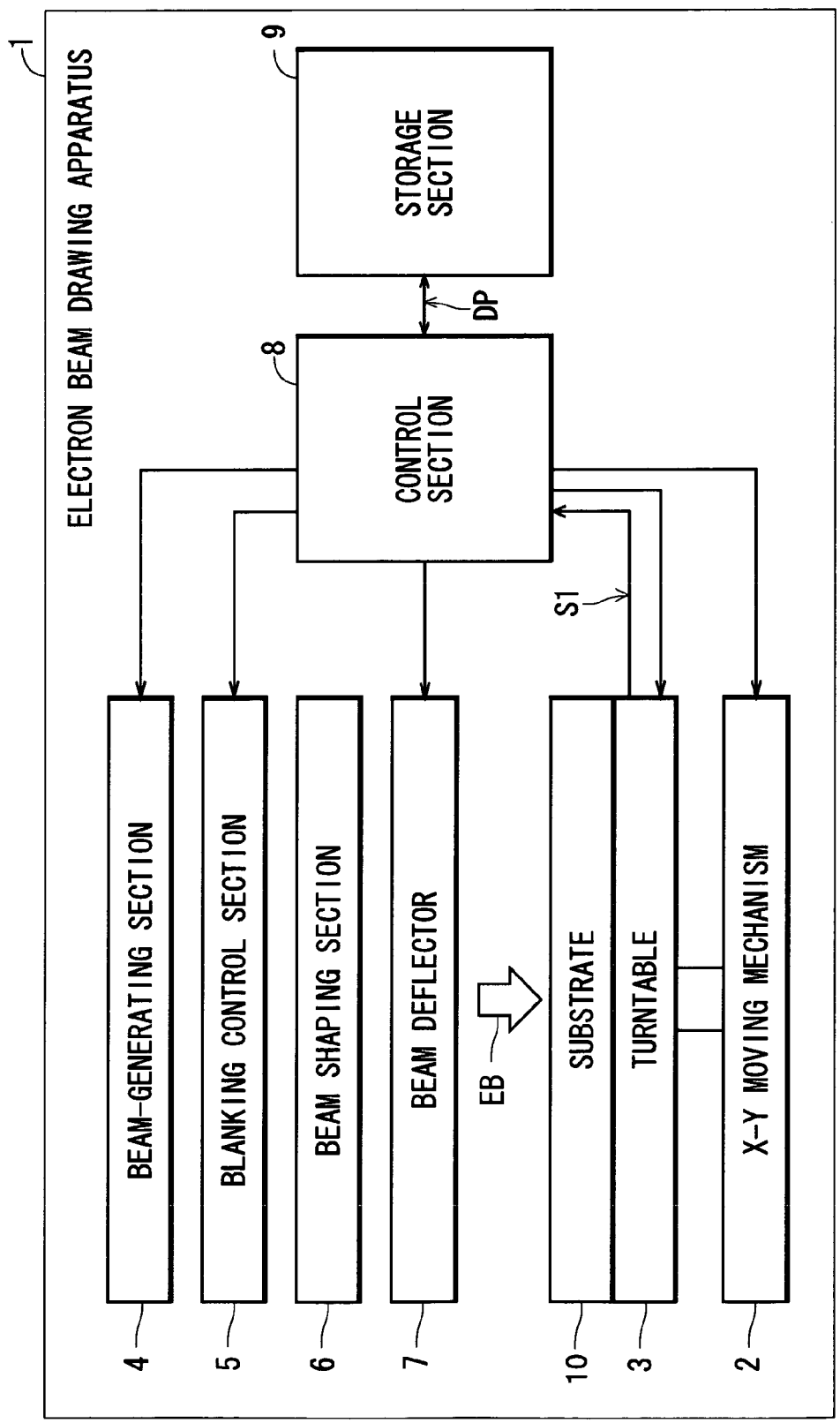
FIG. 1 is a block diagram showing the arrangement of a drawing apparatus.
Figure 2:
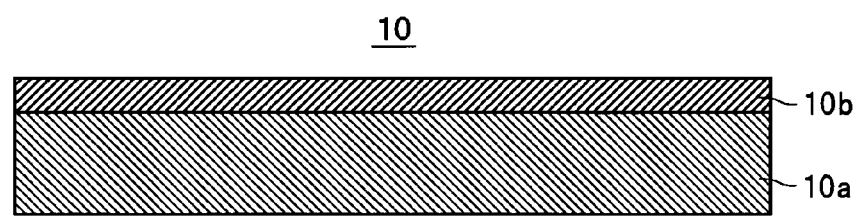
FIG. 2 is a cross-sectional view of a substrate on which an exposure pattern is to be drawn by the drawing apparatus.

The electron beam drawing apparatus (hereinafter also referred to as the "drawing apparatus) 1 corresponds to the pattern drawing apparatus in the present invention. As shown in FIG. 1, the drawing apparatus 1 includes an X-Y moving mechanism 2, a turntable 3, a beam-generating section 4, a blanking control section 5, a beam shaping section 6, a beam deflector 7, a control section 8 and a storage section 9, and is configured to be capable of drawing an exposure pattern P (see FIG. 4) for manufacturing information recording media on a substrate 10 by causing the beam-generating section 4 to emit an electron beam EB (an example of an exposure beam in the present invention). In this case, the substrate 10 is a support for manufacturing a stamper 11 (an example of a master disk for manufacturing information recording media in the present invention: see FIG. 11), and as shown in FIG. 2, has a resin layer 10b formed on a surface of a disk-shaped Si wafer 10a thereof (e.g. a resist layer formed by applying an electron beam-sensitive negative resist onto the surface of the wafer 10a). In this case, the thickness of the resin layer 10b is defined to be approximately 100 nm, for example.

Figure 3:
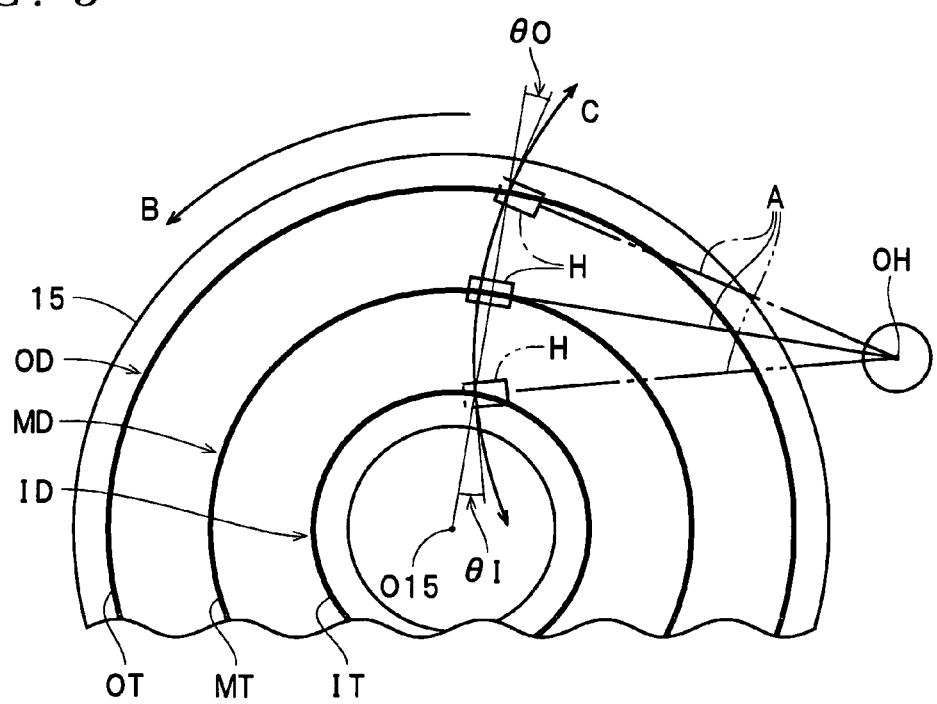
FIG. 3 is a conceptual plan view of a magnetic recording medium manufactured using the exposure pattern drawn by the drawing apparatus.

The stamper 11 manufactured using the substrate 10 is a master disk for manufacturing a discrete track-type magnetic recording medium 15 (an example of an information recording medium in the present invention) shown in FIG. 3. As described hereinafter, the stamper 11 is manufactured by transferring a concave/convex pattern P1 (see FIG. 9) formed by developing the exposure pattern P drawn on the resin layer 10b using the drawing apparatus 1. Further, the magnetic recording medium 15 manufactured using the stamper 11 is accommodated within a housing, not shown, together with such as a motor for rotating the magnetic recording medium 15 and a recording and reproduction head H (floating-type head slider formed with a recording head and a preproduction head) for recording and reproducing recording data on and from the magnetic recording medium 15 to form a magnetic recording device (hard disk drive). In this case, as shown in FIG. 3, the magnetic recording device is configured such that while rotating the magnetic recording medium 15 about a rotation center O15 in a direction indicated by an arrow B, an arm A is pivotally moved about a pivot center OH in a direction indicated by an arrow C to thereby move the recording and reproduction head H to a predetermined radial position on the magnetic recording medium 15, so as to record and reproduce recording data on and from the magnetic recording medium 15.

In this case, as indicated by solid lines in FIG. 3, in a state in which the recording and reproduction head H is on a middle-diameter area track MT in a middle-diameter area MD of the disk of the magnetic recording medium 15, a line segment parallel to the direction of the width of the recording and reproduction head H, and a line segment parallel to the direction of the width of the middle-diameter area track MT are parallel with each other. On the other hand, as indicated by one-dot chain lines in the figure, in a state in which the recording and reproduction head H is on an outer-diameter area track OT in an outer-diameter area OD of the disk of the magnetic recording medium 15, a skew angle θO is formed between the line segment parallel to the direction of the width of the recording and reproduction head H, and a line segment parallel to the direction of the width of the outer-diameter area track OT. Further, as indicated by two-dot chain lines in FIG. 3, in a state in which the recording and reproduction head H is on an inner-diameter area track IT in an inner-diameter area ID of the disk of the magnetic recording medium 15, a skew angle θI is formed between the line segment parallel to the direction of the width of the recording and reproduction head H, and a line segment parallel to the direction of the width of the inner-diameter area track IT.

As described hereinafter, in the magnetic recording medium 15, a concave/convex pattern formed in a magnetic layer defines servo patterns which enable identification of various information e.g. of a burst pattern, a track number, and a sector (servo pattern area) number necessary for placing the recording and reproduction head H on each of tracks concentrically formed on the medium 15. Accordingly, for accurate reading of each of patterns constituting each servo pattern, it is necessary to cause a side of each pattern in the direction of the width thereof to be aligned with the direction of reading width of the recording and reproduction head H over the whole surface (whole area) of the magnetic recording medium 15, while taking into account the skew angles θO and θI in the outer-diameter area OD and the inner-diameter area ID of the magnetic recording medium 15. More specifically, as shown in FIG. 4, as to servo patterns PSM, PSM, . . . of the middle-diameter area tracks MT (, MT, . . . ) each of patterns PSM1, PSM2, . . . is formed to have a generally rectangular shape, thereby making it possible to cause the side of each of the patterns PSM1, PSM2, . . . in the direction of the width thereof to be aligned with the direction of the reading width of the recording and reproduction head H.

In contrast, in the case of servo patterns PSO, PSO, . . . of the outer-diameter area tracks OT (, OT, . . . ) in order to cause a side of each of patterns PSO1, PSO2, . . . in the direction of the width thereof to be aligned with the direction of the reading width of the recording and reproduction head H, it is necessary to give the skew angle θO to each of the patterns PSO1, PSO2, . . . to form each of the pattern into a parallelogrammic shape. Further, as to servo patterns PSI, PSI, . . . of the inner-diameter area tracks IT (, IT, . . . ) in order to cause a side of each of patterns PSI1, PSI2, . . . in the direction of the width thereof to be aligned with the direction of the reading width of the recording and reproduction head H, it is necessary to give the skew angle θI to each of the patterns PSI1, PSI2, . . . to form each of the pattern into a parallelogrammic shape. It should be noted that in the magnetic recording medium 15, e.g. 200 servo pattern areas are defined per track (per one complete rotation of the magnetic recording medium 15) with one servo pattern formed within each servo pattern area, whereby the 200 servo pattern areas are read via the recording and reproduction head H during one rotation of the magnetic recording medium 15, for tracking servo control.

Figure 6:
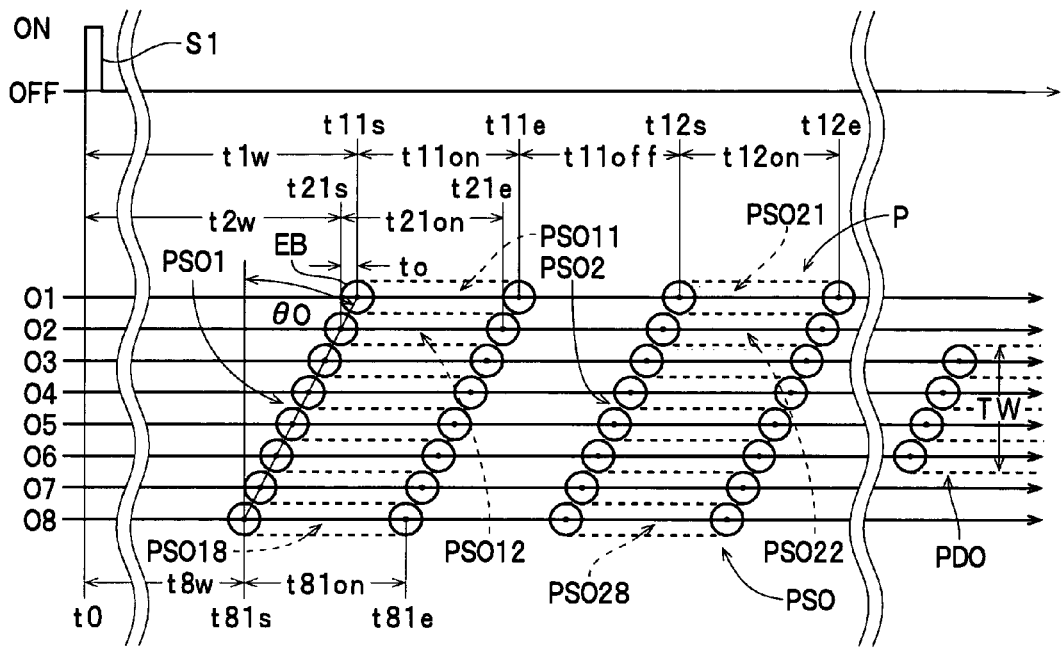
FIG. 6 is a pattern diagram of an exposure pattern drawn on an outer-diameter area of a disk by the drawing apparatus.

The X-Y moving mechanism 2, which corresponds to a moving mechanism in the present invention, moves the turntable 3 on a plane of rotation of the substrate 10 rotated by the turntable 3. The turntable 3 corresponds to a rotating mechanism in the present invention and is configured to be capable of having the substrate 10 placed thereon and rotating the same such that the drawing speed becomes equal to a constant linear speed (e.g. 230 mm/s) under the control of the control section 8. Further, the turntable 3 also corresponds to a reference signal generating section in the present invention, and generates a reference signal S1 synchronous with the rotation of the substrate 10 in response to a signal (e.g. a pulse signal of 36000 pulses generated per one rotation of the table; an internal signal in the present invention) internally generated in synchronism with the rotation of the turntable 3. For example, the turntable 3 outputs the reference signal S1 200 times (equal in number to the number of the servo pattern areas per one complete rotation of the magnetic recording medium 15) during one rotation of the substrate 10. The beam-generating section 4 forms a beam-emitting section in the present invention together with the blanking control section 5, and generates and emits the electron beam EB for drawing the exposure pattern P on the resin layer 10b of the substrate 10. The blanking control section 5 performs ON-OFF control of the electron beam EB emitted by the beam-generating section 4, under the control of the control section 8. The beam shaping section 6 is comprised of a beam shaping lens and an aperture, not shown, and shapes (reduces the diameter of) the electron beam EB emitted by the beam-generating section 4 such that the effective drawing width of the beam becomes equal to e.g. approximately 30 nm. In this case, as shown in FIG. 6, when the drawing apparatus 1 draws e.g. the pattern PSO1 of the servo patterns PSO, it emits the electron beam EB having an effective drawing width narrower than the width of the pattern PSO1 (e.g. the electron beam EB having an effective drawing width substantially equal to one eighth of the width of the pattern PSO1), to thereby draw the whole pattern PSO1 in eight drawing operations. It should be noted that in the case of a data track pattern PDO and the like being drawn (see FIG. 6), the drawing apparatus 1 emits the above electron beam EB to draw the data track pattern PDO in four drawing operations since the track width TW of the data track pattern PDO is narrower than that of the servo patterns PSO and the like. The beam deflector 7 deflects the electron beam EB shaped by the beam shaping section 6, under the control of the control section 8, thereby changing an irradiation position of the electron beam EB on the resin layer 10b.

The control section 8 controls the X-Y moving mechanism 2 to move the substrate 10 together with the turntable 3, and controls the turntable 3 to rotate the substrate 10. Further, the control section 8 controls the beam-generating section 4, the blanking control section 5, and the beam deflector 7 in response to the reference signal S1 delivered by the turntable 3 (reference signal generating section), to thereby apply the electron beam EB to a predetermined location on the resin layer 10b of the substrate 10 being rotated by the turntable 3. The storage section 9 stores drawing process data DP enabling identification of a drawing procedure for drawing the exposure pattern P on the substrate 10. The drawing process data DP stores information enabling identification of a standby time period from a time point when the reference signal S1 is delivered to a time point when the blanking control section 5 is caused to start emission of the electron beam EB, on a servo pattern-by-servo pattern basis, and data enabling identification of the length of a pattern forming each servo pattern along the track (i.e. a time period during which the blanking control section 5 performs ON control of the electron beam EB).

Next, a method of drawing the exposure pattern P on the substrate 10 using the drawing apparatus 1 will be described with reference to the drawings.

Figure 5:
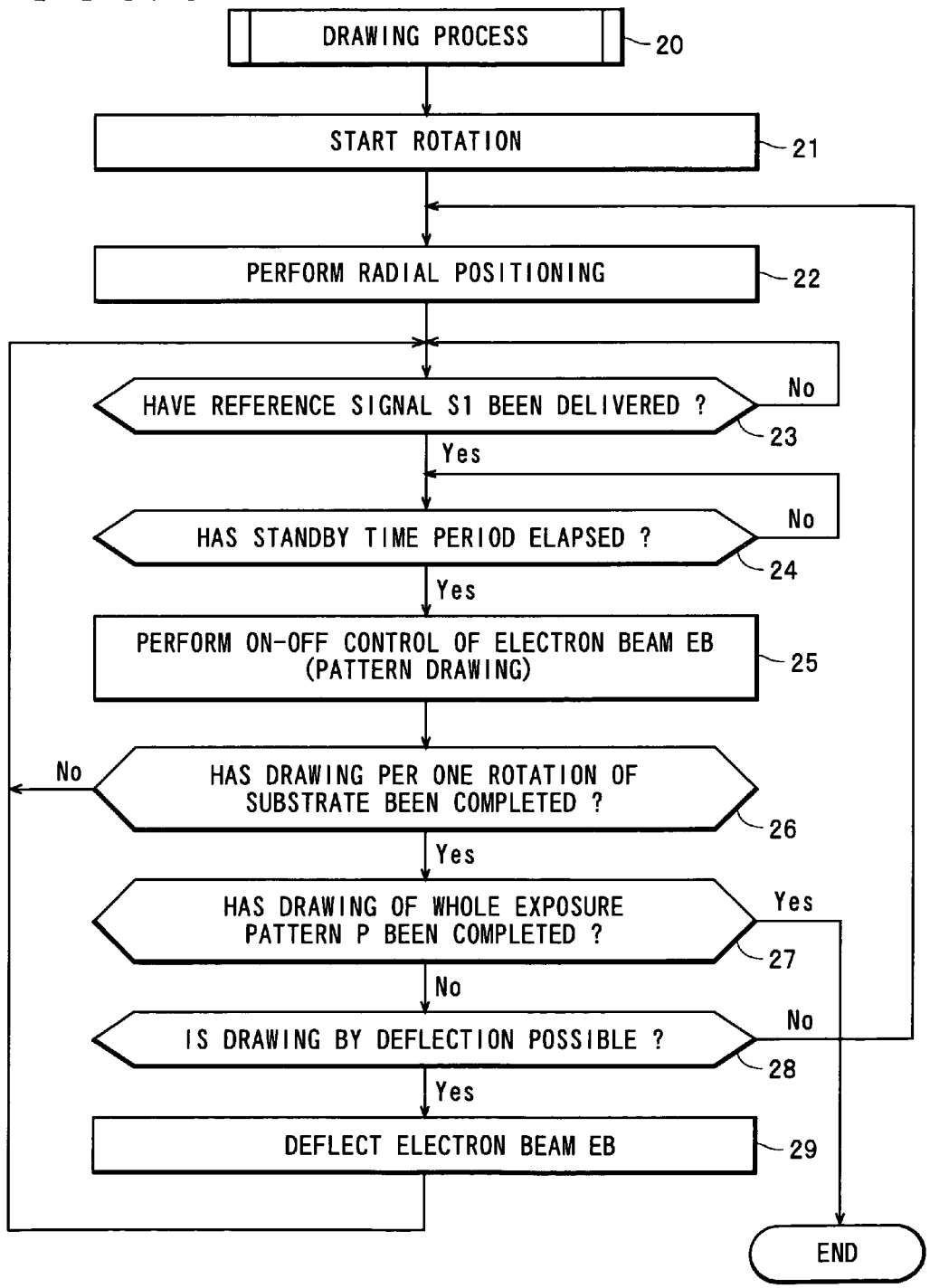
FIG. 5 is a flowchart of a drawing process executed by the drawing apparatus.

First, the substrate 10 is placed on the turntable 3 such that a surface thereof on which the resin layer 10b is formed faces upward. Then, the control section 8 starts a drawing process 20 shown in FIG. 5. In the drawing process 20, first, the control section 8 causes the turntable 3 to rotate the substrate 10 such that the substrate 10 is rotated at a desired drawing speed (linear-speed) at a predetermined drawing position (radial position) (step 21). Then, the control section 8 causes the X-Y moving mechanism 2 to radially move the substrate 10 together with the turntable 3 to thereby position the substrate 10 such that a drawing start location on the substrate 10 where the drawing of the exposure pattern P is to be started is positioned exactly under the beam-generating section 4 (step 22: hereinafter this moving processing will be also referred to as the "radial positioning"). For example, the drawing apparatus 1 starts the drawing of the exposure pattern P from a portion of the substrate 10 corresponding to a location on the outer-diameter area OD of the disk of the magnetic recording medium 15. Therefore, the control section 8 causes the X-Y moving mechanism 2 to perform the radial positioning to bring an outer-diameter area of the substrate 10 exactly below the beam-generating section 4. Then, the control section 8 monitors whether or not the reference signal S1 has been delivered by the turntable 3 (step 23), and when the reference signal S1 has been delivered, the control section 8 determines according to the drawing process data DP whether or not the standby time period before the start of drawing of a servo pattern PSO to be drawn has elapsed (step 24).

More specifically, as shown in FIG. 6, when drawing the pattern PSO1 of the servo patterns PSO, the drawing apparatus 1 draws the pattern PSO1 by drawing each of eight pattern segments PSO11 to PSO18 formed by dividing the pattern PSO1 in the direction of width thereof. To this end, first, the control section 8 controls the beam deflector 7 according to the drawing process data DP stored in the storage section 9 to cause the irradiation position of the electron beam EB on the resin layer 10b to coincide with a position indicated by an arrow O1, and causes the blanking control section 5 to start the ON-OFF control of the electron beam EB (control of permitting and inhibiting the emission of the electron beam EB) after being on standby for a time period t1w (an example of the standby time period in the present invention) from a time point t0 when the reference signal S1 is delivered to a time point t11s when the drawing of the pattern segment PSO11 is to be started (step 25). It should be noted that although in FIG. 6, the irradiation position of the electron beam EB is indicated as if it were moved in a direction indicated by each of the arrows O1 to O8, actually, the substrate 10 is moved (rotated) from right to left, as viewed in the figure, whereby the irradiation position of the electron beam EB is relatively moved with respect to the substrate 10. Then, the control section 8 causes the blanking control section 5 to emit the electron beam EB during a time period t11on from the start of the emission of the electron beam EB to a time point t11e when the drawing of the pattern segment PSO11 is to be completed. When the time point t11e has come, the control section 8 causes the blanking control section 5 to stop the emission of the electron beam EB, whereby the drawing of the pattern segment PSO11 is completed.

Subsequently, according to the drawing process data DP, the control section 8 waits for a time period t11off until a time point t12s when the drawing of a pattern segment PSO21 of a pattern PSO2 is to be started. When the time point t12s has come, the control section 8 causes the blanking control section 5 to start the emission of the electron beam EB, and when a time point t12e has come, the control section 8 causes the blanking control section 5 to stop the emission of the electron beam EB. Thus, the drawing of the pattern segment PSO21 is completed. Thereafter, as to patterns PSO3, PSO4, . . . (see FIG. 4) as well, the control section 8 similarly causes first pattern segments of the patterns to be drawn (performs a partial drawing process in the present invention). Then, when the partial drawing of a servo pattern PSO (and a data track pattern PDO) within one servo pattern area has been completed, the control section 8 determines whether or not the drawing of the pattern segments of the servo patterns PSO, PSO, . . . to be drawn per one rotation (per full circle) of the substrate 10 has been completed (step 26). If the control section 8 determines that the drawing has not been completed (if the control section 8 determines that there exist servo patterns PSO, PSO, . . . to be drawn), the present process returns to the step 23, wherein the control section 8 monitors the delivery of the reference signal S1. Whenever the reference signal S1 is delivered by the turntable 3, similarly to the drawing process of the servo pattern PSO, described above, the control section 8 starts drawing the pattern segments PSO11, PSO21, . . . of patterns PSO1, PSO2, . . . of the servo pattern PSO drawing of which has not been started.

On the other hand, if the drawing of the pattern segments of the servo patterns PSO, PSO, . . . to be drawn per one rotation of the substrate 10 has been completed (step 26), the control section 8 determines whether or not the drawing of the entire exposure pattern P to be drawn on the substrate 10 has been completed (step 27). If the control section 8 determines that the drawing of the entire exposure pattern P has not been completed, the control section 8 determines whether or not the following pattern segments can be drawn by deflection of the electron beam EB by the beam deflector 7 without driving the X-Y moving mechanism 2 (step 28). If the control section 8 determines that the pattern segments can be drawn, the control section 8 controls the beam deflector 7 according to the drawing process data DP stored in the storage section 9 to cause the irradiation position of the electron beam EB on the resin layer 10b to coincide with a position indicated by an arrow O2 in FIG. 6 (step 29: an example of a drawing position-changing process in the present invention). It should be noted that although in the above example, the drawing apparatus 1 is configured to change the irradiation position of the electron beam EB by the deflection of the electron beam EB caused by the beam deflector 7, the beam deflector 7 is not necessarily required, but the drawing apparatus 1 can also be configured to change the irradiation position of the electron beam EB by moving the turntable 3 (substrate 10) using the X-Y moving mechanism 2. If the drawing apparatus 1 is thus configured, the step 22 is executed in place of the steps 28 and 29.

Then, the control section 8 causes the blanking control section 5 to start the ON-OFF control of the electron beam EB after being on standby for a time period t2w (another example of the standby time period in the present invention) from a time point t0 when the reference signal S1 is delivered to a time point t21s when the drawing of a pattern segment PSO12 is to be started (step 25). Then, the control section 8 causes the blanking control section 5 to emit the electron beam EB for a time period t21on from the start of the emission of the electron beam EB to a time point t21e when the drawing of the pattern segment PSO12 is to be completed. When the time point t21e has come, the control section 8 causes the blanking control section 5 to stop the emission of the electron beam EB. Thus, the drawing of the pattern segment PSO12 is completed.

In this case, the drawing process data DP stored in the storage section 9 contains information for making the time period t2w from the time point when the reference signal S1 is delivered during the second rotation of the substrate 10 to the time point t21s when the drawing of the pattern segment PSO12 is to be started shorter by a time period "to" than the time period t1w from the time point t0 when the reference signal S1 is delivered during the first rotation of the substrate 10 to the time point t11s when the drawing of the pattern segment PSO11 is to be started. The time period "to" is defined by taking the existence of the skew angle θO described above into account such that a line segment connecting a drawing start position of the pattern segment PSO11 and a drawing start position of the pattern segment PSO12 becomes parallel to the direction of the width of the recording and reproduction head H placed on the outer-diameter area track OT. Therefore, as shown in FIG. 6, the pattern segment PSO12 is drawn according to the drawing process data DP at a location forward of the pattern segment PSO11 (location shifted closer to a location which came exactly under the beam-generating section 4 when the reference signal S1 was delivered at the time point t0). As a result, a displacement corresponding to the skew angle θO occurs between the pattern segments PSO11 and PSO12.

Then, the control section 8 causes a pattern segment PSO22 of the pattern PSO2 to be drawn. Thereafter, as to the patterns PSO3, PSO4, . . . (see FIG. 4) as well, the control section 8 similarly causes second pattern segments of the patterns to be drawn (the partial drawing process in the present invention). Then, when the partial drawing of the servo pattern PSO (and the data track pattern PDO) within one servo pattern area has been completed, the control section 8 determines whether or not the drawing of the pattern segments of the servo patterns PSO, PSO, . . . to be drawn per one rotation of the substrate 10 has been completed (step 26). If the control section 8 determines that the drawing has not been completed, the present process returns to the step 23, wherein the control section 8 monitors the delivery of the reference signal S1. Further, whenever the reference signal S1 is delivered by the turntable 3, similarly to the drawing process of the above servo pattern PSO, the control section 8 causes the pattern segments PSO12, PSO22, . . . to be drawn. A sequence of operations of the above-described partial drawing process (steps 23 to 29) are repeatedly performed during eight rotations of the substrate 10, for example.

It should be noted that in the drawing apparatus 1, after completion of the drawing process for drawing some (pattern segments PSO13, PSO23, . . . in the illustrated example) of the segments of each of the patterns constituting the servo pattern PSO in the direction of the width of the patterns, the drawing process is executed on segments corresponding to a part of a track width TW of a data track pattern PDO (see FIG. 6) to be formed between the one servo pattern area and a servo pattern area where the servo pattern PSO should be drawn next. The drawing process of the data track pattern PDO is similar to that of the servo pattern PSO, and the like, and the drawing of the servo pattern PSO and the drawing of the data track pattern PDO are alternately and successively performed, as described hereinafter. Consequently, when the drawing of the pattern segments PSO18, PSO28, . . . of the patterns PSO1, PSO2, . . . is completed, the drawing of the servo patterns PSO, PSO, . . . , and data track patterns PDO, PDO, . . . on the first track is completed. In the following, for ease of understanding of the present invention, the description will be mainly given of the drawing process for drawing the servo pattern.

Next, when the control section 8 draws the servo patterns PSO, PSO, . . . on a second track (track radially inward of the track having the servo patterns PSO, PSO, . . . drawn thereon), if the control section 8 determines that it is difficult to draw the pattern segments PSO11, PSO12, . . . by the deflection of the electron beam EB by the beam deflector 7 (step 28), the control section 8 causes the X-Y moving mechanism 2 to perform the radial positioning (step 22: another example of the drawing position-changing process in the present invention). After that, the control section 8 repeatedly executes the sequence of operations of the process in the steps 23 to 29 described above to thereby draw the servo patterns PSO, PSO, . . . , and data track patterns PDO, PDO, . . . on the second track. Similarly, as to a third track et seq. as well, the control section 8 draws servo patterns PSO, PSO, . . . , and data track patterns PDO, PDO, . . . on the tracks. The drawing process data DP contains information for making the aforementioned time period "to" shorter as the patterns are drawn on a track closer to the center of the disk. Therefore, the drawn servo patterns PSO, PSO, . . . have a smaller skew angle θO given to the patterns PSO1, PSO2, . . . , as the patterns are drawn on a track closer to the center of the disk.

Figure 7:
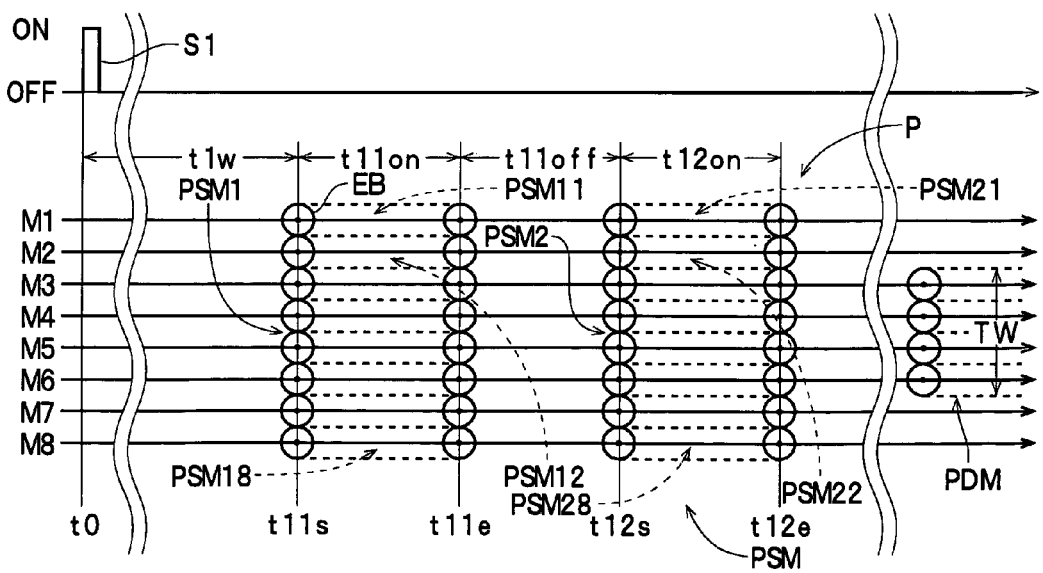
FIG. 7 is a pattern diagram of an exposure pattern drawn on a middle-diameter area of the disk by the drawing apparatus.

When the servo patterns PSM, PSM, . . . are drawn on a track corresponding to the middle-diameter area track MT, the control section 8 is detected whether or not the reference signal S1 has been delivered by the turntable 3 (step 23), whereafter the control section 8 is determined according to the drawing process data DP whether or not a standby time period before the start of drawing a servo pattern PSM to be drawn has elapsed (step. 24). More specifically, as shown in FIG. 7, first, the control section 8 controls the beam deflector 7 to cause the irradiation position of the electron beam EB on the resin layer 10b to coincide with a position indicated by an arrow M1, and causes the blanking control section 5 to start the ON-OFF control of the electron beam EB, after being on standby for a time period t1w (an example of the standby time period in the present invention) from a time point t0 when the reference signal S1 is delivered to a time point t11s when the drawing of a pattern segment PSM11 is to be started (step 25). Then, the control section 8 causes the blanking control section 5 to emit the electron beam EB for a time period t11on from the start of the emission of the electron beam EB to a time point t11e when the drawing of the pattern segment PSM11 is to be completed. When the time point t11e has come, the control section 8 causes the blanking control section 5 to stop the emission of the electron beam EB, whereby the drawing of the pattern segment PSM11 is completed.

Subsequently, the control section 8 causes a pattern segment PSM21 of a pattern PSM2 according to the drawing process data DP to be drawn. Similarly, as to patterns PSM3, PSM4, . . . (see FIG. 4) as well, the control section 8 causes first pattern segments of the patterns to be drawn (the partial drawing process in the present invention). Then, the control section 8 determines whether or not the drawing of the pattern segments of the servo patterns PSM, PSM, . . . to be drawn per one rotation of the substrate 10 has been completed. If the above drawing has been completed (step 26), the control section 8 determines whether or not the drawing of the entire exposure pattern P to be drawn on the substrate 10 has been completed (step 27). Further, if the control section 8 determines that the drawing of the entire exposure pattern P has not been completed, the control section 8 determines whether or not the next pattern segments can be drawn by the deflection of the electron beam EB by the beam deflector 7 (step 28). If the control section 8 determines that the next pattern segments can be drawn by the deflection, the control section 8 controls the beam deflector 7 to cause the irradiation position of the electron beam EB on the resin layer 10b to coincides with a position indicated by an arrow M2 (step 29: an example of the drawing position-changing process in the present invention).

Next, the control section 8 causes the blanking control section 5 to start the ON-OFF control of the electron beam EB after being on standby for a time period t1w from a time point t0 when the reference signal S1 is delivered by the turntable 3 to a time point t11s when the drawing of a pattern segment PSM12 is to be started (step 25). Since there is no need to give either the skew angle θO or θI in drawing the servo pattern PSM, the control section 8 causes the drawing of the pattern segment PSM12 to be started after being on standby for a time period equal to the time period t1w over which the control section 8 was on standby in drawing the pattern segment PSM11. After drawing a pattern segment PSM22, as to the patterns PSM3, PSM4, . . . (see FIG. 4) as well, the control section 8 similarly causes second pattern segments of the patterns to be drawn (the partial drawing process in the present invention). Then, when the partial drawing of the servo pattern PSM within one servo pattern area has been completed, the control section 8 determines whether or not the drawing of the pattern segments of the servo patterns PSM, PSM, . . . to be drawn per one rotation of the substrate 10 has been completed (step 26). If the control section 8 determines that the above drawing has not been completed, the present process returns to the step 23, wherein the control section 8 monitors the delivery of the reference signal S1. Further, when the reference signal S1 has been delivered by the turntable 3, similarly to the drawing process of the above servo pattern PSM, the control section 8 causes the pattern segments PSM12, PSM22, . . . to be drawn. The control section 8 repeatedly performs the sequence of operations of the above partial drawing process (steps 23 to 29) during eight rotations of the substrate 10, whereby the drawing of pattern segments PSM18, PSM28, . . . of the patterns PSM1, PSM2, . . . is completed to complete the drawing of the servo patterns PSM, PSM, . . . , and data track patterns PDM, PDM, . . . on tracks corresponding to the middle-diameter area track MT.

Figure 8:
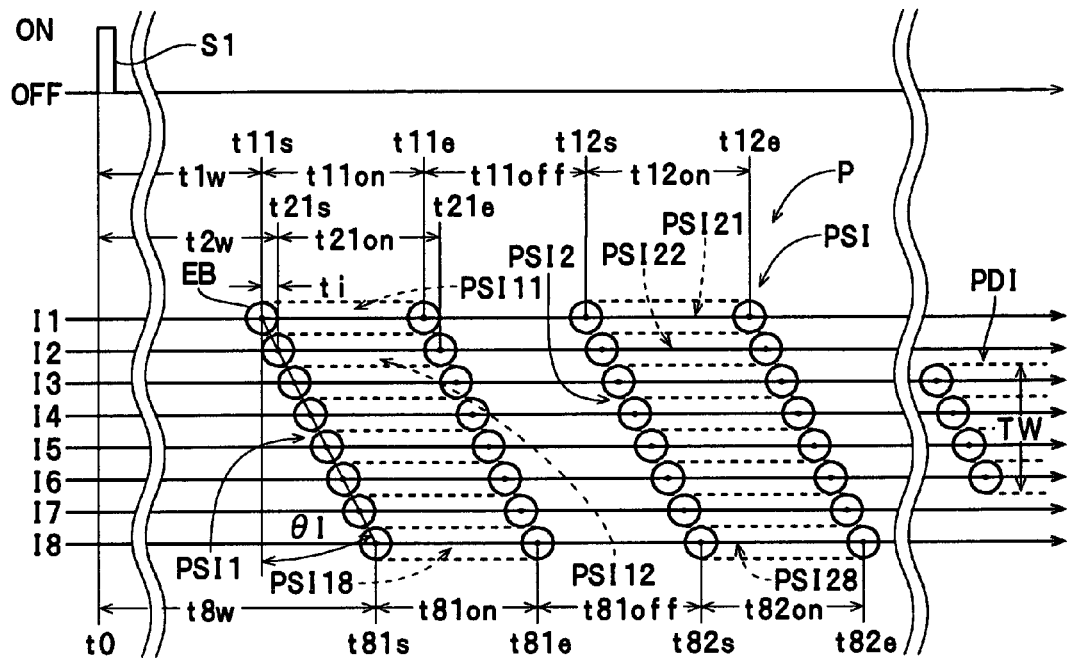
FIG. 8 is a pattern diagram of an exposure pattern drawn on an inner-diameter area of the disk by the drawing apparatus.

Similarly, the control section 8 causes servo patterns PS1, PS1, . . . of tracks corresponding to the inner-diameter area track IT of the inner-diameter area ID of the disk. More specifically, as shown in FIG. 8, first, the control section 8 controls the beam deflector 7 according to the drawing process data DP stored in the storage section 9 to cause the irradiation position of the electron beam EB on the resin layer 10b to coincide with a position indicated by an arrow I1, and causes the blanking control section 5 to start the ON-OFF control of the electron beam EB after being on standby for a time period t1w (an example of the standby time period in the present invention) from a time point t0 when the reference signal S1 is delivered to a time point t11s when the drawing of the pattern segment PSI11 is to be started (step 25). Then, the control section 8 causes the blanking control section 5 to emit the electron beam EB for a time period t11on from the start of the emission of the electron beam EB to a time point t11e when the drawing of the pattern segment PSI11 is to be completed. When the time point t11e has come, the control section 8 causes the blanking control section 5 to stop the emission of the electron beam EB, whereby the drawing of the pattern segment PSI11 is completed.

Subsequently, according to the drawing process data DP, after being on standby for a time period t11off until a time point t12s when the drawing of a pattern segment PSI21 of a pattern PSI2 is to be started, the control section 8 causes, at the time point t12s, the blanking control section 5 to start the emission of the electron beam EB, and when a time point t12e has come, the control section 8 causes the blanking control section 5 to stop the emission of the electron beam EB. Thus, the drawing of the pattern segment PSI21 is completed. After that, as to patterns PSI3, PSI4, . . . (see FIG. 4) as well, the control section 8 similarly causes first pattern segments of the patterns to be drawn (the partial drawing process in the present invention). Then, when the partial drawing of a servo pattern PSI within one servo pattern area has been completed, the control section 8 determines whether or not the drawing of the pattern segments of the servo patterns PSI, PSI, . . . to be drawn per one rotation of the substrate 10 has been completed (step 26). If the control section 8 determines that the drawing has not been completed, the present process returns to the step 23, wherein the control section 8 monitors the delivery of the reference signal S1. Further, when the reference signal S1 has been delivered by the turntable 3, similarly to the drawing process of the above servo pattern PSI, the control section 8 causes the pattern segments PSI11, PSI21, . . . to be drawn.

On the other hand, if the drawing of the pattern segments of the servo patterns PSI, PSI, . . . to be drawn per one rotation of the substrate 10 has been completed (step 26), the control section 8 determines whether or not the drawing of the entire exposure pattern P to be drawn on the substrate 10 has been completed (step 27). If the control section 8 determines that the drawing has not been completed, the control section 8 determines whether or not the following pattern segments can be drawn by the deflection of the electron beam EB by the beam deflector 7 (step 28). If the control section 8 determines that the pattern segments can be drawn, the control section 8 controls the beam deflector 7 according to the drawing process data DP stored in the storage section 9 to cause the irradiation position of the electron beam EB on the resin layer 10b to coincide with a position indicated by an arrow I2 in FIG. 8 (step 29: an example of the drawing position-changing process in the present invention). Then, the control section 8 causes the blanking control section 5 to start the ON-OFF control of the electron beam EB after being on standby for a time period t2w (an example of the standby time period in the present invention) from a time point t0 when the reference signal S1 is delivered to a time point t21s when the drawing of a pattern segment PSI12 is to be started (step 25). Subsequently, the control section 8 causes the blanking control section 5 to emit the electron beam EB for a time period t21on from the start of the emission of the electron beam EB to a time point t21e when the drawing of the pattern segment PSI12 is to be completed. After that, when the time point t21e has come, the control section 8 causes the blanking control section 5 to stop the emission of the electron beam EB. Thus, the drawing of the pattern segment PSI12 is completed.

The drawing process data DP stored in the storage section 9 contains information for making the time period t2w from the time point when the reference signal S1 is delivered during the second rotation of the substrate 10 to the time point t21s when the drawing of the pattern segment PSI12 is to be started longer by a time period ti than the time period t1w from the time point t0 when the reference signal S1 is delivered during the first rotation in the inner-diameter area of the substrate 10 to the time point t11s when the drawing of the pattern segment PSI11 is to be started. The time period ti is defined by taking the existence of the skew angle θI into account such that a line segment connecting a drawing start position of the pattern segment PSI11 and a drawing start position of the pattern segment PSI12 becomes parallel to the direction of the width of the recording and reproduction head H placed on the inner-diameter area track IT. Therefore, as shown in FIG. 8, the pattern segment PSI12 is drawn according to the drawing process data DP at a location backward of the pattern segment PSI11 (location shifted away from a location which came exactly under the beam-generating section 4 when the reference signal S1 was delivered at the time point t0). As a result, a displacement corresponding to the skew angle θI occurs between the pattern segments PSI11 and PSI12.

Subsequently, the control section 8 draws a pattern segment PSI22 of the pattern PSI2. After that, as to the patterns PSI3, PSI4, . . . (see FIG. 4) as well, the control section 8 similarly causes second pattern segments of the patterns to be drawn (the partial drawing process in the present invention). Then, when the partial drawing of the servo pattern PSI within one servo pattern area has been completed, the control section 8 determines whether or not the drawing of the pattern segments of the servo patterns PSI, PSI, . . . to be drawn per one rotation of the substrate 10 has been completed (step 26). If the control section 8 determines that the drawing has not been completed, the present process returns to the step 23, wherein the control section 8 monitors the delivery of the reference signal S1. Further, when the reference signal S1 has been delivered by the turntable 3, similarly to the drawing process of the above servo pattern PSI, the control section 8 causes the pattern segments PSI12, PSI22, . . . to be drawn. The control section 8 repeatedly performs the sequence of operations of the above partial drawing process (steps 23 to 29) during eight rotations of the substrate 10. Thus, the drawing of pattern segments PSI18, PSI28, . . . of the patterns PSI1, PSI2, . . . has been completed to complete the drawing of the servo patterns PSI, PSI, . . . and data track patterns PDI, PDI, . . . on one track.

Next, when the control section 8 causes servo patterns PSI, PSI, . . . to be drawn on a track radially inward of the track having the servo patterns PSI, PSI, . . . drawn thereon, if the control section 8 determines that it is difficult to draw the pattern segments PSI11, PSI12, . . . by the deflection of the electron beam EB by the beam deflector 7 (step 28), the control section 8 causes the X-Y moving mechanism 2 to perform the radial positioning (step 22: another example of the drawing position-changing process in the present invention). After that, the control section 8 repeatedly executes the sequence of operations of the process in the steps 23 to 29 described above to thereby draw the servo patterns PSI, PSI, . . . , and the data track patterns PDI, PDI, . . . Similarly, the control section 8 causes the servo patterns PSI, PSI, . . . , and the data track patterns PDI, PDI, . . . to be drawn on a track further radially inward of the above track. The drawing process data DP contains information for making the aforementioned time period ti longer as the patterns are drawn on a track closer to the center of the disk. Therefore, the drawn servo patterns PSI, PSI, . . . have a larger skew angle θI given to the patterns PSI1, PSI2, . . . , as the patterns are drawn on a track closer to the center of the disk. The control section 8 repeatedly executes the sequence of operations of the above process (the partial drawing process for the servo patterns PSI and the partial drawing process for the data track patterns PDI) from the outer-diameter portion of the substrate 10 to the inner-diameter portion thereof (from a portion corresponding to the outer-diameter area OD of the disk to a portion corresponding to the inner-diameter area ID of the disk), and when the control section 8 determines that the drawing of the entire exposure pattern P has been completed (step 27), the drawing process 20 is terminated. Thus, the drawing of the exposure pattern P (all the servo patterns and data track patterns) on the resin layer 10b of the substrate 10 is completed.

As described hereinabove, according to the drawing apparatus 1, the partial drawing process (the steps 23 to 25 in the drawing process 20) in which the control section 8 causes segments (the pattern segments PSO11, PSO21, . . . , and so forth) divided in the direction of the width of the patterns PSO1, PSO2, . . . , PSM1, PSM2, . . . , PSI1, PSI2, . . . to be drawn by emitting the electron beam EB after being on standby for a standby time period (each of the time periods t1w, t2w, . . . in the illustrated example) defined in advance from the detection of the delivery of the reference signal S1, and the drawing position-changing process (the step 22 or 29 in the drawing process 20) for changing the drawing position on which drawing is executed by the partial drawing process are alternately performed a plurality of times, for drawing the exposure pattern P on the resin layer 10b, whereby the formation of marks or the like for specifying reference positions on the substrate 10 can be made unnecessary. This makes it possible to reduce the manufacturing costs of the stamper 11 and the magnetic recording medium 15 manufactured using the stamper 11. Further, since patterns having a desired skew angle θO or θI given thereto can be drawn simply by changing and setting the standby time period before the start of the emission of the electron beam EB as required, it is possible to manufacture the magnetic recording medium 15 from which the servo patterns PSO, PSO, . . . , and the like drawn thereon can be accurately read. Further, it is unnecessary to form marks or the like for specifying reference positions, so that e.g. in drawing the exposure pattern P for manufacturing the stamper 11 using the drawing apparatus 1, it is possible to dispense with a process for forming a mark for specifying a central position, and a process for causing the mark specifying the central position to coincide with the center of rotation of the substrate 10, thereby making it possible to draw the exposure pattern P accurately and easily.

Further, according to the drawing apparatus 1, the reference signal S1 is emitted a plurality of times during a time period over which the turntable 3 causes one rotation of the substrate 10, and hence e.g. compared with a configuration for delivering the reference signal S1 once per one rotation of the substrate 10, a time period from the time point t0 when each reference signal S1 is delivered to a time point when the drawing of the servo pattern PSO or the like is to be started is shortened, whereby it is possible to more accurately draw the servo patterns PSO, PSO, . . . , and the like to be drawn per one rotation of the substrate 10. In this case, if the reference signal S1 is delivered a number of times corresponding to the number of servo pattern areas on which the servo patterns (servo pattern PSO, etc.) should be drawn, respectively, during a time period over which the turntable 3 causes one rotation of the substrate 10, it is possible to determine timing in which the drawing of each of all the servo patterns is to be stared, based on the delivery of the reference signal S1 which is executed in association with each of the servo patterns. This makes it possible to more accurately draw the servo patterns PSO, PSO, . . . which should be drawn per one rotation of the substrate 10.

Next, a method of manufacturing the stamper 11 by using the substrate 10 having the exposure pattern P drawn thereon using the drawing apparatus 1 (the concave/convex pattern-forming method in the present invention) will be described with reference to the drawings.

Figure 9:
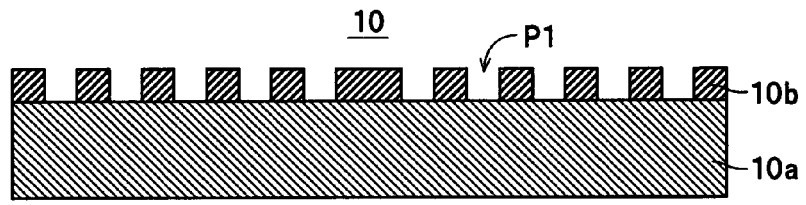
FIG. 9 is a cross-sectional view of a substrate with a concave/convex pattern formed by developing the substrate on which the exposure pattern has been drawn by the drawing apparatus.
Figure 10:
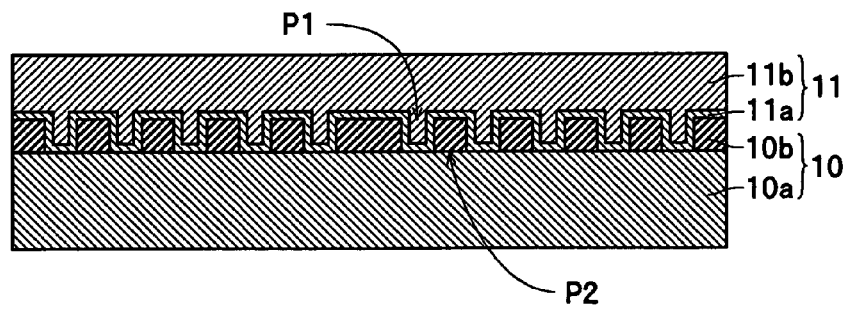
FIG. 10 is a cross-sectional view of the substrate having a stamper formed on the concave/convex pattern thereof, by depositing a film-forming layer and an electrolytic nickel layer on the pattern, in the mentioned order.
Figure 11:
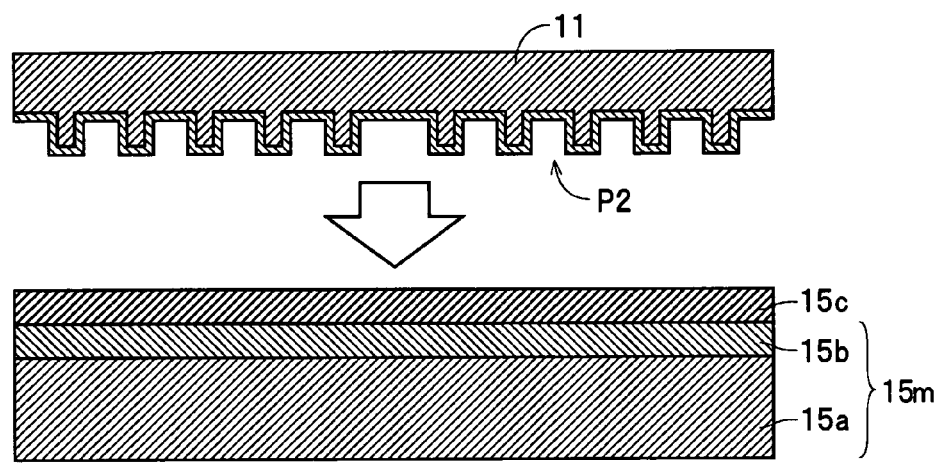
FIG. 11 is a cross-sectional view of an intermediate and the stamper, which is useful in explaining the step of manufacturing a magnetic recording medium by the imprinting method using the stamper.

First, the substrate 10 having the exposure pattern P drawn thereon is subjected to a development treatment, whereby as shown in FIG. 9, portions of the resin layer 10b to which the electron beam EB was not irradiated are removed to form a concave/convex pattern P1. Then, as shown in FIG. 10, a film-forming layer 11a is formed by the sputtering method to cover the concave/convex pattern P1, and an electrolytic nickel layer 11b is formed by performing a plating treatment using the film-forming layer 11a as an electrode. Thus, a stamper 11 having a concave/convex pattern P2 with the concave/convex pattern P1 transferred thereto is formed on the substrate 10 using this concave/convex pattern P1. Then, the stamper 11 is removed from the Si wafer 10a and washed with a solvent or the like as required, whereby the stamper 11 is completed as shown in FIG. 11. In this case, the completed stamper 11 is formed with the concave/convex pattern P2 having the same shape in plan view as that of the exposure pattern P drawn on the resin layer 10b of the substrate 10 using the drawing apparatus 1. Therefore, portions of the concave/convex pattern P2 corresponding respectively to the outer-diameter area OD and the inner-diameter area ID of the disk have servo patterns formed by patterns with a skew angle θO or θI given thereto during the drawing of the exposure pattern P.

As described hereinabove, according to the method of manufacturing the stamper 11, the stamper 11 is manufactured by transferring the concave/convex pattern P1 formed by executing the predetermined treatments on the resin layer 10b having the exposure pattern P drawn thereon using the aforementioned drawing apparatus 1, whereby it is possible to make it unnecessary to form marks or the like for specifying reference positions on the substrate 10. This makes it possible to reduce the manufacturing costs of the stamper 11. Since the stamper 11 is manufactured by drawing thereon the exposure pattern P provided with the skew angles θO and θI defined in advance for the patterns (e.g. the pattern PSO1, PSO2, . . . , and so forth) forming each servo pattern (e.g. the servo pattern PSO) within one servo pattern area, it is possible to manufacture the magnetic recording medium 15 from which the servo patterns PSO, PSO, . . . , and so forth drawn thereon can be accurately read from the outer-diameter area OD and the inner-diameter area ID of the disk. Further, when the exposure pattern P is drawn by the drawing apparatus 1, the partial drawing process for drawing patterns forming the servo pattern PSO and the like within one servo pattern area is first executed, and then there is executed the partial drawing process for drawing the data track pattern PDO and the like to be formed between the one servo pattern area and a servo pattern area where a servo pattern PSO and the like should be drawn next. This makes it possible to collectively draw the servo patterns and the data track patterns. Therefore, it is possible to manufacture the stamper 11 which is capable of collectively forming high-precision servo patterns having desired skew angles given thereto, and data track patterns for recording data.

Next, the method of manufacturing the magnetic recording medium 15 using the stamper 11 will be described with reference to drawings.

Figure 12:
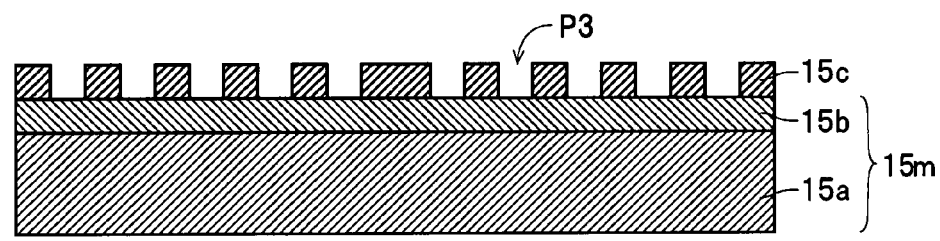
FIG. 12 is a cross-sectional view of the intermediate with the concave/convex pattern of the stamper being transferred onto a resin layer.
Figure 13:
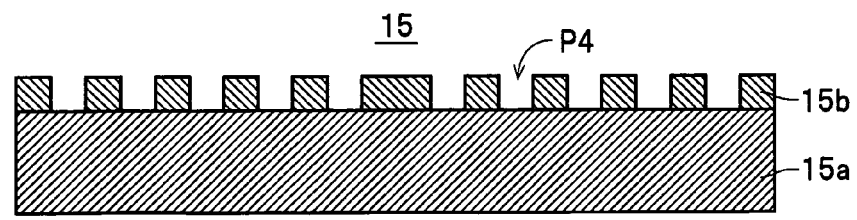
FIG. 13 is a cross-sectional view of the magnetic recording medium having a magnetic layer etched using the resin layer formed with the concave/convex pattern as a mask.

First, as shown in FIG. 11, while heating an intermediate 15m on which the resin layer 15c is formed, the stamper 11 is pressed against the intermediate 15m by the imprinting method. As a result, as shown in FIG. 12, the concave/convex pattern P2 of the stamper 11 is transferred to the resin layer 15c to form the concave/convex pattern P3 on the intermediate 15m. The intermediate 15m is for manufacturing the magnetic recording medium 15, and comprised of a disk-shaped substrate 15a and a magnetic layer 15b formed thereon. It should be noted that actually, the intermediate 15m is comprised of an underlayer, a soft magnetic layer, an alignment layer, a recording layer (magnetic layer 15b), and a protective layer, deposited on the substrate 15a. However, for ease of understanding of the present invention, description and illustration of details of the intermediate 15m are omitted. Secondly, the intermediate 15m is etched using the concave/convex pattern P3 as a mask. Before etching, the magnetic layer 15b is exposed from the bottom of concave portions of the concave/convex pattern P3, and by further executing the etching process, the concave/convex pattern P4 is formed on the magnetic layer 15b, as shown in FIG. 13.

The concave/convex pattern P4 is formed using the concave/convex pattern P2, more specifically using the concave/convex pattern P3 as a mask, which has been formed by transferring the concave/convex pattern P2. Therefore, the patterns, to which the skew angle θO or θI was given when the exposure pattern P was drawn, are transferred to form the servo patterns of the outer-diameter area OD and the inner-diameter area ID of the concave/convex pattern P4, similarly to the concave/convex pattern P2. Thereafter, the magnetic recording medium 15 is completed by filling the concave portions of the concave/convex pattern P4 with a non-magnetic material, then causing the magnetic layer 15b (the top of each convex portion of the concave/convex pattern P4) to be exposed from the non-magnetic material e.g. by grinding, and e.g. forming a protective layer on the surface of the magnetic layer 15b.

As described above, according to the method of manufacturing the magnetic recording medium 15, the concave/convex pattern P4 is formed by transferring the concave/convex pattern P3 corresponding to the exposure pattern P drawn by the drawing apparatus 1 described above, and since the manufacturing costs of the stamper 11 are reduced, it is possible to reduce the manufacturing costs of the magnetic recording medium 15. Further, by using the stamper 11 formed with the concave/convex pattern P3 in which the skew angles θO and θI are given to servo patterns PSO, PSO, . . . , and PSI, PSI, . . . of portions corresponding to the outer-diameter area OD and the inner-diameter area ID, it is possible to enable the servo patterns PSO, PSO, . . . or the like to be read accurately. Further, when the exposure pattern P is drawn by the drawing apparatus 1 during the manufacturing of the stamper 11, the partial drawing process for drawing patterns forming the servo pattern PSO and the like within one servo pattern area is first executed, and then there is executed the partial drawing process for drawing the data track pattern PSD and the like to be formed between the one servo pattern area and a servo pattern area where a servo pattern PSO and the like should be drawn next. This makes it possible to collectively draw the servo patterns and the data track patterns. Therefore, it is possible to collectively form high-precision servo patterns having desired skew angles given thereto, and data track patterns for recording data.

Next, another method of drawing the exposure pattern P by the drawing apparatus 1 will be described with reference to drawings.

First, after placing the substrate 10 on the turntable 3 such that a surface thereof on which the resin layer 10b is formed faces upward, the control section 8 causes the turntable 3 to rotate the substrate 10. Then, the control section 8 executes the radial positioning by causing the X-Y moving mechanism 2 to radially move the substrate 10 together with the turntable 3. For example, the drawing apparatus 1 starts the drawing of the exposure pattern P from a portion of the substrate 10 corresponding to a location on the outer-diameter area OD of the disk of the magnetic recording medium 15. Therefore, the control section 8 causes the X-Y moving mechanism 2 to perform the radial positioning to bring an outer-diameter portion of the substrate 10 exactly below the beam-generating section 4. Then, the control section 8 monitors whether or not the reference signal S1 has been delivered by the turntable 3, and when the reference signal S1 has been delivered, the control section 8 determines according to the drawing process data DP whether or not the standby time period before the start of drawing of a servo pattern PSO to be drawn has elapsed.

Figure 14:
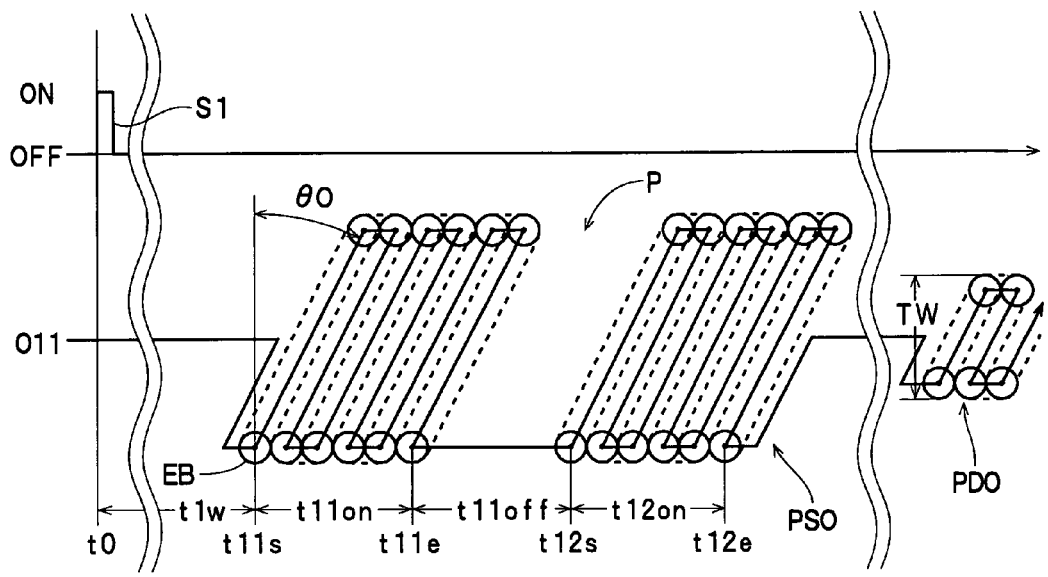
FIG. 14 is a-pattern diagram of an exposure pattern drawn on an outer-diameter area of a disk by another drawing method executed by the drawing apparatus.

More specifically, as shown in FIG. 14, the control section 8 controls the beam deflector 7 according to the drawing process data DP stored in the storage section 9 to cause the irradiation position of the electron beam EB on the resin layer 10b to coincide with the center line of a track including the servo pattern PSO to be drawn, and causes the blanking control section 5 to start the ON-OFF control of the electron beam EB after being on standby for a time period t1w (an example of the standby time period in the present invention) from a time point t0 when the reference signal S1 is delivered to a time point t11s when the drawing of a first pattern of the servo pattern PSO to be drawn is to be started. At the same time, the control section 8 causes the beam deflector 7 to reciprocate the electron beam EB in the direction of the width of the servo pattern PSO to be drawn, in dependence on the rotational speed of the turntable 3 (substrate 10). In doing this, to draw the servo pattern PSO, the drawing apparatus 1 defines and controls several conditions, including the deflecting direction (direction of reciprocation) of the electron beam EB by the electron beam deflector 7, the speed of reciprocation, and the like, according to the skew angle θO to be given to each pattern of the servo pattern PSO and the rotational speed of the substrate 10. As a result, the irradiation position of the electron beam EB on the resin layer 10b is caused to proceed in a meandering or reciprocating manner, as shown in FIG. 14 by an arrow O11.

Further, after causing the blanking control section 5 to emit the electron beam EB during a time period t11on from the start of the emission of the electron beam EB to a time point t11e when the drawing of the first pattern in the servo pattern PSO is to be completed, when the time point t11e has come, the control section 8 causes the blanking control section 5 to stop the emission of the electron beam EB, the first pattern in the servo pattern PSO is drawn on the resin layer 10b. After this, the control section 8 causes the second and following patterns of the servo pattern PSO to be drawn in the same manner, and after the drawing of the servo pattern PSO in one servo pattern area is completed, the control section 8 causes the data track pattern PDO to be drawn. Then, the control section 8 causes the servo pattern PSO to be drawn in the next servo pattern area. By repeatedly executing this drawing process, the drawing of servo patterns PSO, PSO, . . . , and data track patterns PDO, PDO, . . . on a first track is completed. Then, the control section 8 causes the X-Y moving mechanism 2 to move the irradiation position of the electron beam EB to an inner location on the substrate 10, and thereafter, causes the servo patterns PSO, PSO, . . . , and the data track patterns PDO, PDO, . . . to be drawn on a second track in the same manner. Further, the control section 8 also causes the drawing to be executed on a third track et seq. in the same manner. In this case, the servo patterns PSO, PSO, . . . , which are given a skew angle θO dependent on each track, are drawn by gradually reducing the angle of the direction of deflection by the electron beam deflector 7 (the aforementioned skew angle θO) in which the electron beam EB is reciprocated, whenever servo patterns PSO, PSO, . . . are drawn on each inner track.

Figure 15:
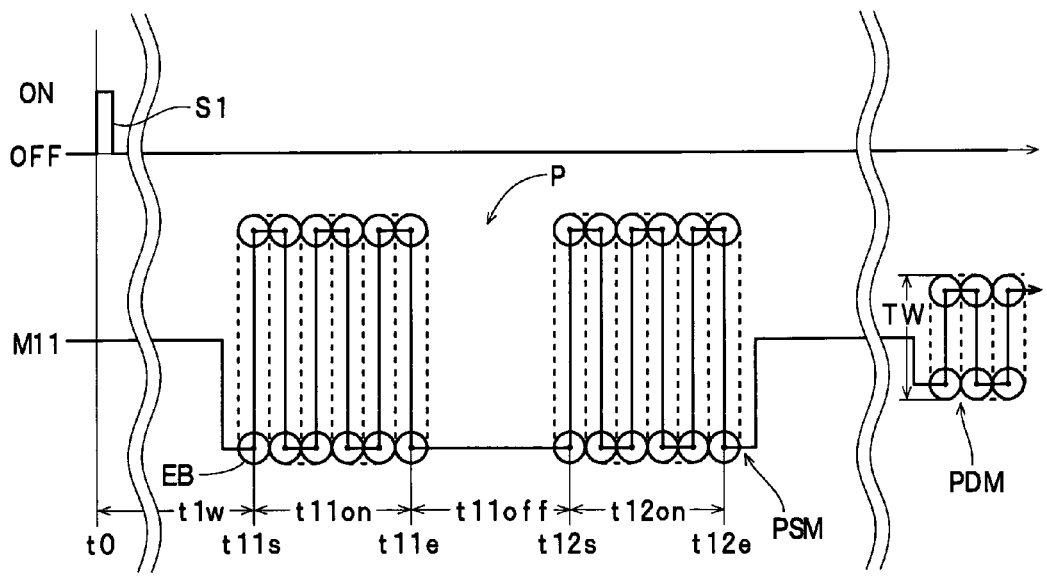
FIG. 15 is a pattern diagram of an exposure pattern drawn on a middle-diameter area of the disk by the other drawing method executed by the drawing apparatus.

On the other hand, when the servo patterns PSM, PSM, . . . , and data track patterns PDM, PDM, . . . are drawn on tracks corresponding to the middle-diameter area track MT, it is detected whether or not the reference signal S1 has been delivered by the turntable 3, and when the reference signal S1 has been delivered, as shown in FIG. 15, similarly to the drawing of the servo patterns PSO and the data track patterns PDO, described above, the control section 8 causes the blanking control section 5 to start the ON-OFF control of the electron beam EB, after being on standby for a predetermined standby time period (in the present case, t1w ), and causes the beam deflector 7 to deflect the electron beam EB to be swung. In this case, when drawing the servo pattern PSM and data track pattern PDM, it is not necessary to give either the skew angle θO or θI to the patterns thereof, and hence the control section 8 causes the electron beam EB to reciprocate such that the irradiation position of the electron beam EB proceeds in a manner meandering or reciprocating in directions perpendicular to the center line of the track including the servo pattern PSM and the data track pattern PDM in dependence on the rotational speed of the substrate 10. As a result, the irradiation position of the electron beam EB on the resin layer 10b is caused to proceed in a meandering manner as shown by an arrow M11. This completes the drawing of the servo patterns PSM, PSM, . . . , and data track patterns PDM, PDM, . . .

Figure 16:
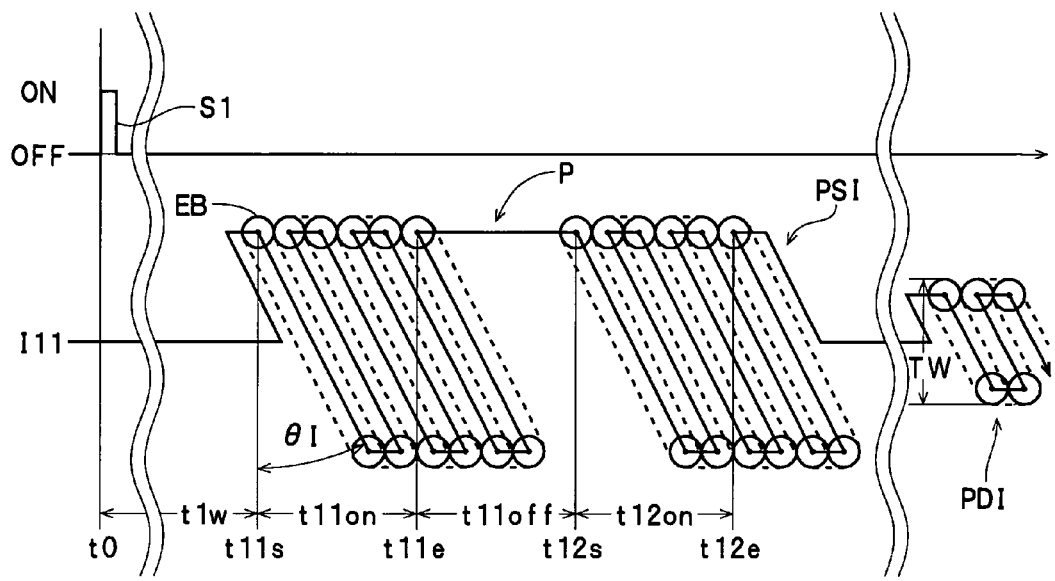
FIG. 16 is a pattern diagram of an exposure pattern drawn on an inner-diameter area of the disk by the other drawing method executed by the drawing apparatus.

Further, as to tracks corresponding to the inner-diameter area track IT of the inner-diameter area ID of the disk, as shown in FIG. 16, the control section 8 controls the beam deflector 7 to cause the irradiation position of the electron beam EB on the resin layer 10b to coincide with a center line of a track including the servo patterns PSI to be drawn, and causes the blanking control section 5 to start the ON-OFF control of the electron beam EB after being on standby for a time period t1w (an example of the standby time period in the present invention) from a time point t0 when the reference signal S1 is delivered to a time point t11s when the drawing of the servo pattern PSI is to be started. At the same time, the control section 8 controls the beam deflector 7 and causes the beam deflector 7 to reciprocate the electron beam EB in the direction of the width of a servo pattern PSI to be drawn, in dependence on the rotational speed of the substrate 10. In doing this, to draw the servo pattern PSI, the drawing apparatus 1 defines and controls several conditions including the deflecting direction (direction of reciprocation) of the electron beam EB by the electron beam deflector 7, the speed of reciprocation, and the like, according to the skew angle θI to be given to each pattern of the servo pattern PS1 and the rotational speed of the substrate 10. As a result, the irradiation position of the electron beam EB on the resin layer 10b is caused to proceed in a meandering or reciprocating manner, as shown in FIG. 16 by an arrow I11.

Further, the control section 8 causes the blanking control section 5 to emit the electron beam EB during a time period t11on from the start of the emission of the electron beam EB to a time point t11e when the drawing of a first pattern of the servo pattern PSI is to be completed. When the time point t11e has come, the control section 8 causes the blanking control section 5 to stop the emission of the electron beam EB, whereby the first pattern in the inner-diameter area of the servo pattern PSI is drawn on the resin layer 10*b*. After this, the control section 8 causes the second and following patterns in the same area of the servo pattern PSI to be drawn in the same manner, and after the drawing of the servo pattern PSI in one servo pattern area is completed, the control section 8 causes the data track pattern PDO to be drawn. Then, the control section 8 causes a servo pattern PSI to be drawn in the next servo pattern area. By repeatedly executing this drawing process, the drawing of the servo patterns PSI, PSI, . . . , and data track patterns PDI, PDI, . . . on a track is completed. Then, the control section 8 causes the X-Y moving mechanism 2 to move the irradiation position of the electron beam EB to an inner location on the substrate 10, and thereafter, causes the servo patterns PSI, PSI, . . . , and the data track patterns PDI, PDI, . . . to be drawn on the next track in the same manner. Further, as to further inner tracks, the control section 8 causes the drawing to be executed in the same manner. In this case, the servo patterns PSI, PSI, . . . which are given a skew angle θI dependent on each track, are drawn by gradually increasing the angle of the direction of deflection by the electron beam deflector 7 (the aforementioned skew angle θI) in which the electron beam EB is caused to reciprocate, whenever the servo patterns PSI, PSI, . . . are drawn on each inner track. By executing the drawing process described above on the whole surface of the substrate 10, the drawing of the exposure pattern P on the resin layer 10*b* of the substrate 10 is completed.

As described hereinabove, the drawing apparatus 1, draws the exposure pattern P on the resin layer 10*b* by executing the drawing process in which after being on standby over a standby time period (each of the time periods t1*w*, . . . in the illustrated example) defined in advance from the detection of the delivery of the reference signal S1, the electron beam EB is caused to be emitted while reciprocating the same in the direction of the width of the patterns to be drawn, to draw patterns (servo patterns PSO and the like), whereby the formation of marks or the like for specifying reference positions on the substrate 10 can be made unnecessary. This makes it possible to reduce the manufacturing costs of the stamper 11 and the magnetic recording medium 15 manufactured using the stamper 11. Further, since patterns having a desired skew angle θO or θI given thereto can be drawn simply by deflecting the direction of reciprocation of the electron beam EB as required, it is possible to manufacture the magnetic recording medium 15 from which the servo patterns PSO, PSO, . . . , and the like drawn thereon can be accurately read. Further, it is unnecessary to form marks or the like for specifying reference positions, so that e.g. in drawing the exposure pattern P for manufacturing the stamper 11 using the drawing apparatus 1, it is possible to dispense with a process for forming a mark for specifying a central position, and a process for causing the mark specifying the central position to coincide with the center of rotation of the substrate 10, thereby making it possible to draw the exposure pattern P accurately and easily.

Next, a still another method of drawing the exposure pattern P by the drawing apparatus 1 will be described with reference to the drawings. It should be noted that description and illustration of steps similar to those in the drawing method described above are omitted.

Figure 17:
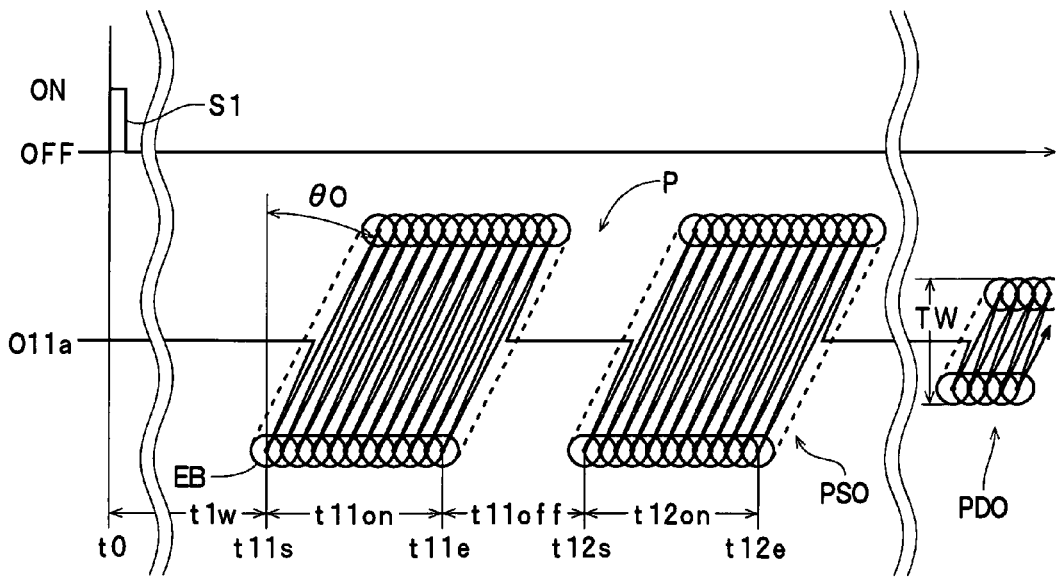
FIG. 17 is a pattern diagram of an exposure pattern drawn on an outer-diameter area of a disk by still another drawing method executed by the drawing apparatus.

In the method described above, although the servo pattern PSO is drawn by causing the irradiation position of the electron beam EB on the resin layer 10*b* to proceed in a meandering manner, as shown in FIG. 14 by the arrow O11, this is not limitative, but the servo pattern PSO can be drawn by causing the irradiation position of the electron beam EB on the resin layer 10*b* to proceed in a meandering manner as shown in FIG. 17. More specifically, the control section 8 causes the X-Y moving mechanism 2 to perform the radial positioning to bring an outer-diameter portion of the substrate 10 exactly under the beam-generating section 4. Then, the control section 8 monitors whether or not the reference signal S1 has been delivered by the turntable 3, and when the reference signal S1 has been delivered, the control section 8 determines according to the drawing process data DP whether or not a standby time period before the start of drawing of a servo pattern PSO to be drawn has elapsed. In the meanwhile, the control section 8 controls the beam deflector 7 according to the drawing process data DP stored in the storage section 9 to cause the irradiation position of the electron beam EB on the resin layer 10*b* to coincide with the center line of a track including the servo pattern PSO to be drawn, and causes the blanking control section 5 to start the ON-OFF control of the electron beam EB after being on standby for a time period t1*w* (an example of the standby time period in the present invention) from a time point t0 when the reference signal S1 is delivered to a time point t11*s* when the drawing of a first pattern of the servo pattern PSO to be drawn is to be started.

At the same time, the control section 8 causes the beam deflector 7 to reciprocate the electron beam EB at high speed in the direction of the width of the servo pattern PSO to be drawn. In doing this, to draw the servo pattern PSO, the drawing apparatus 1 defines and controls several conditions, including the deflecting direction (direction of reciprocation) of the electron beam EB by the electron beam deflector 7, the speed of reciprocation, and the like, according to the skew angle θO to be given to each pattern of the servo pattern PSO and the rotational speed of the substrate 10. Further, the control section 8 causes the beam-generating section 4 to properly adjust the power of the electron beam EB, by taking into account multiple exposure caused by high-speed reciprocation of the electron beam EB. Further, after causing the blanking control section 5 to emit the electron beam EB for a time period t11*on* from the start of the emission of the electron beam EB to a time point t11*e* when the drawing of the first pattern in the servo pattern PSO is to be completed, when the time point t11*e* has come, the control section 8 causes the blanking control section 5 to stop the emission of the electron beam EB, whereby the drawing of the pattern segment PSI11 is completed. After this, the control section 8 causes the second and following patterns of the servo pattern PSO to be drawn in the same manner, and after the drawing of the servo pattern PSO in one servo pattern area is completed, causes the data track pattern PDO to be drawn. Then, the control section 8 causes a servo pattern PSO to be drawn in the next servo pattern area. By repeatedly executing this drawing process, the drawing of servo patterns PSO, PSO, . . . , and data track patterns PDO, PDO, . . . on a first track is completed. Thereafter, the control section 8 also executes the drawing process as to servo patterns PSM, PSM, . . . and data track patterns PDM, PDM, . . . , or servo patterns PSI, PSI, . . . and data track patterns PDI, PDI, . . . in the same manner. This completes the drawing of the exposure pattern P on the resin layer 10*b* of the substrate 10.

As described hereinabove, the drawing apparatus 1 draws the exposure pattern P on the resin layer 10*b* by executing the drawing process in which after being on standby over the standby time period (each of the time periods t1*w*, . . . in the illustrated example) defined in advance from the detection of the delivery of the reference signal S1, the electron beam EB is caused to be emitted while reciprocating the same in the direction of the width of the patterns to be drawn, to draw patterns (servo patterns PSO and the like), so that the formation of marks or the like for specifying reference positions on the substrate 10 can be made unnecessary. This makes it possible to reduce the manufacturing costs of the stamper 11 and the magnetic recording medium 15 manufactured using the stamper 11. Further, since patterns having a desired skew angle θO or θI given thereto can be drawn simply by deflecting the direction of reciprocation of the electron beam EB as required, it is possible to manufacture the magnetic recording medium 15 from which the servo patterns PSO, PSO, . . . , and the like drawn thereon can be accurately read. Further, it is unnecessary to form marks or the like for specifying reference positions, so that e.g. in drawing the exposure pattern P for manufacturing the stamper 11 using the drawing apparatus 1, it is possible to dispense with a process for forming a mark for specifying a central position, and a process for causing the mark specifying the central position to coincide with the center of rotation of the substrate 10, thereby making it possible to draw the exposure pattern P accurately and easily.

It should be noted that the present invention is by no means limited to the configuration and the method described above. For example, in the method described above, the description is given of the example in which after drawing the exposure pattern P, the concave/convex pattern P1 is formed, and then the stamper 11 is manufactured by transferring the concave/convex pattern P1. However, the present invention is not limited to this, but the aforementioned concave/convex pattern P3 may be formed by drawing the exposure pattern P directly on the resin layer 15c formed on the intermediate 15m and executing the development treatment on the resin layer by the drawing apparatus 1, and then using this concave/convex pattern P3 as a mask, the magnetic recording medium 15 can be manufactured. According to this method, the magnetic recording medium 15 is manufactured using the concave/convex pattern P3 corresponding to the exposure pattern P, which is formed on the resin layer 15c on the intermediate 15m by the drawing apparatus 1, so that it is unnecessary to form marks for specifying reference positions on the intermediate 15m, as distinct from the method of starting the drawing of patterns by detecting the marks or the like for specifying the reference positions. Therefore, the manufacturing costs of the magnetic recording medium 15 can be reduced. In this case, the magnetic recording medium 15 is manufactured by drawing the exposure pattern P in which each of patterns forming a servo pattern within each servo pattern area is given a skew angle θO or θI defined in advance. This makes it possible to manufacture the magnetic recording medium 15 from which servo patterns and the like can be accurately read from the outer-diameter area OD and inner-diameter area ID of the disk. Further, in drawing the exposure pattern P using the drawing apparatus 1, after executing the partial drawing process for drawing patterns forming the servo pattern PSO and the like within one servo pattern area, there is executed the partial drawing process for drawing the data track pattern PDO and the like to be formed between the one servo pattern area and a servo pattern area where a servo pattern PSO and the like should be drawn next. This makes it possible to collectively draw the servo patterns and the data track patterns. Therefore, it is possible to collectively form high-precision servo patterns and data track patterns for recording data.

Further, in the method described above, the description is given of the example in which the magnetic recording medium 15 is manufactured by etching the intermediate 15m using the concave/convex pattern P3 formed thereon as a mask. However, the method of manufacturing an information recording medium in the present invention is not limited to this, but the magnetic recording medium 15 can be manufactured by forming the concave/convex pattern P4 by the lift-off method. Moreover, in the method described above, the description is given of the example in which the exposure pattern P is drawn by irradiation using the electron beam EB. However, the drawing beam in the present invention is not limited to the electron beam EB, but any suitable energy beams may be used. Although the description is given of the method of drawing the exposure pattern P for manufacturing a discrete track-type magnetic recording medium 15 and a stamper 11 for manufacturing the magnetic recording medium 15, the information recording medium in the present invention is not limited to the discrete track-type magnetic recording medium, but it also includes a magnetic recording medium (medium on which a concave/convex pattern is formed only in areas of servo patterns) to which is applied the method of manufacturing a master disk for manufacturing information recording media and a method of manufacturing an information recording medium, when the servo patterns are formed, and a so-called patterned medium in which data recording portions (magnetic material portions) formed by dividing the data recording area in a mesh form or in dots (magnetically separating each data recording track into a plurality of potions in the direction of length thereof (direction of rotation of the medium)) are isolated from each other in the form of islands.

Moreover, although the drawing apparatus 1 described above employs a configuration in which the turntable 3 generates the reference signal S1 synchronous with the rotation of the substrate 10 with reference to a pulse signal (internal signal) internally generated in synchronism with the rotation of the table, and delivers the same to the control section 8, this is not limitative, but it is possible to employ another configuration, for example, in which the control section 8 generates the reference signal S1 synchronous with the rotation of the substrate 10 with reference to a drive signal for rotating the turntable 3, and outputs the drive signal to the turntable 3. It is also possible to employ a configuration in which a drive signal generating section is additionally provided for generating a drive signal for rotating the turntable 3, and the drive signal generating section generates the reference signal S1 synchronous with the rotation of the substrate 10 with reference to the drive signal and delivers the reference signal S1 to the control section 8, while delivering the drive signal to the turntable 3. Further, the number of times of delivery of the reference signal S1 per rotation of the substrate 10 is not limited to the above-described example, but it is only essential that the number is one or more, so that it can be set to a desired value of one or more. Additionally, although the description has been given of the example of drawing the exposure pattern P by applying a negative resist (resin layer 10b) on the surface of the Si wafer 10a, this is not limitative, but various materials, such as a positive resist, may be used for the material for forming the resin layer of the present invention.

What is claimed is:
1. A pattern drawing method comprising:
    rotating a substrate having a resin layer formed on a surface thereof, for having a concave/convex pattern formed on the resin layer for producing information recording media, by a rotating mechanism;
    moving the rotating mechanism along a plane on which the substrate is rotated; and
    emitting a drawing beam toward the resin layer while controlling timing of both emission of the drawing beam and stoppage of the emission of the drawing beam, so as to draw an exposure pattern for forming the concave/convex pattern on the resin layer, wherein a circle drawing process that performs a partial drawing process a plurality of times per circle of the substrate according to the number of patterns, and a drawing position-changing process are alternately performed a plurality of times, the partial drawing processes being performed after a predetermined standby time period in response to output of a reference signal that is synchronous with rotation of the substrate and generated with reference to either an internal signal generated within the rotating mechanism or a rotation drive signal supplied to the rotating mechanism, by emitting the drawing beam that has an effective drawing width narrower than a width and a length of each of patterns forming the exposure pattern so as to draw a part of each of the patterns which is partial in a direction of the width of each of the patterns, the drawing position-changing process changing a position on the resin layer where the part is to be drawn by each of the partial drawing processes, in a predetermined one of a direction toward a center of rotation of the substrate by the rotating mechanism and a direction away from the center of rotation, within a range of the effective drawing width, so as to draw the exposure pattern on the resin layer, the standby time period being changed prior to a start of the partial drawing processes of a said circle drawing process performed after completion of the prior said circle drawing process.

2. The pattern drawing method as claimed in claim 1, wherein the exposure pattern includes at least one of a servo pattern for tracking servo and a data track pattern for data recording.

3. The pattern drawing method as claimed in claim 2, wherein the exposure pattern is formed by giving a predetermined skew angle to the at least one of the patterns.

4. The pattern drawing method as claimed in claim 1, wherein the reference signal is output a plurality of times during one rotation of the substrate caused by the rotating mechanism.

5. The pattern drawing method as claimed in claim 1, wherein the exposure pattern includes servo patterns to be drawn within a plurality of servo pattern areas for tracking servo; and wherein the reference signal is output a plurality of times per one rotation of the substrate, a number of the times corresponding to a number of the servo pattern areas within which the servo patterns are to be drawn per one rotation of the substrate caused by the rotating mechanism.

6. A method of manufacturing a master disk for manufacturing information recording media, comprising the steps of:

executing a predetermined process on the resin layer after drawing the exposure pattern on the resin layer by the pattern drawing method as claimed in claim 1 to thereby form the concave/convex pattern; and forming the master disk having a concave/convex pattern transferred thereto, using the formed concave/convex pattern.

7. A method of manufacturing an information recording medium, comprising the step of forming the information recording medium having a concave/convex pattern transferred thereto using the concave/convex pattern formed on the master disk for manufacturing information recording media, the master disk being manufactured by the method as claimed in claim 6.

8. A method of manufacturing an information recording medium, comprising the steps of:

drawing the exposure pattern on the resin layer formed on an information recording medium intermediate as the substrate, by the pattern drawing method as claimed in claim 1;

forming the concave/convex pattern by executing a predetermined process on the resin layer; and producing the information recording medium using the concave/convex pattern.

\* \* \* \* \*